US009824618B2

(12) United States Patent
Ohara et al.

(10) Patent No.: US 9,824,618 B2
(45) Date of Patent: Nov. 21, 2017

(54) DISPLAY DEVICE AND METHOD FOR DRIVING SAME

(71) Applicant: Sharp Kabushiki Kaisha, Osaka-shi, Osaka (JP)

(72) Inventors: Masanori Ohara, Osaka (JP); Noboru Noguchi, Osaka (JP); Noritaka Kishi, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 35 days.

(21) Appl. No.: 15/039,098

(22) PCT Filed: Aug. 28, 2014

(86) PCT No.: PCT/JP2014/072536
§ 371 (c)(1),
(2) Date: May 25, 2016

(87) PCT Pub. No.: WO2015/093100
PCT Pub. Date: Jun. 25, 2015

(65) Prior Publication Data
US 2017/0162101 A1    Jun. 8, 2017

(30) Foreign Application Priority Data

Dec. 19, 2013 (JP) ................................. 2013-262378

(51) Int. Cl.
*G09G 3/3291* (2016.01)
*G09G 3/20* (2006.01)
(Continued)

(52) U.S. Cl.
CPC ......... *G09G 3/2018* (2013.01); *G09G 3/3233* (2013.01); *G09G 3/3258* (2013.01);
(Continued)

(58) Field of Classification Search
CPC .. G09G 3/2018; G09G 3/3291; G09G 3/3233; G09G 3/3258; G09G 3/3266
See application file for complete search history.

(56) References Cited

U.S. PATENT DOCUMENTS

| 2004/0108518 A1* | 6/2004 | Jo ........................... G09G 3/006 257/200 |
| 2006/0158402 A1* | 7/2006 | Nathan ................ G09G 3/3233 345/82 |

(Continued)

FOREIGN PATENT DOCUMENTS

| JP | 2004-004673 A | 1/2004 |
| JP | 2006284959 A | 10/2006 |

(Continued)

OTHER PUBLICATIONS

International Search Report PCT/ISA/210 for International Application No. PCT/JP2014/072536 dated Dec. 2, 2014.

(Continued)

*Primary Examiner* — Amare Mengistu
*Assistant Examiner* — Cory Almeida
(74) *Attorney, Agent, or Firm* — ScienBiziP, P.C.

(57) ABSTRACT

When a clock signal pulse number and a compensation-target-line address indicating a compensation-target row match, the following control is carried out with a time point being a starting point of a current measurement period, the time point being one horizontal scanning period after a time point of the match. At a current measurement period starting point and ending point, only the potential of the one of the clock signals applied to a unit circuit corresponding to the compensation-target row is changed. Throughout the current measurement period, the clock operation of the clock signals is stopped. A monitor enable signal, that is applied to a control terminal of an output control transistor for control- (Continued)

ling active signal output to a monitor control line, is only set to a high level during the current measurement period.

14 Claims, 30 Drawing Sheets

(51) Int. Cl.
G09G 3/3258 (2016.01)
G09G 3/3233 (2016.01)
G09G 3/3266 (2016.01)
H01L 27/32 (2006.01)
H01L 51/50 (2006.01)

(52) U.S. Cl.
CPC ......... *G09G 3/3266* (2013.01); *G09G 3/3291* (2013.01); *H01L 27/3211* (2013.01); *H01L 27/3244* (2013.01); *H01L 51/5036* (2013.01); *G09G 2300/0814* (2013.01); *G09G 2310/0286* (2013.01); *G09G 2310/0289* (2013.01); *G09G 2310/08* (2013.01); *G09G 2320/0295* (2013.01); *G09G 2320/0626* (2013.01)

(56) References Cited

U.S. PATENT DOCUMENTS

| 2006/0221015 A1* | 10/2006 | Shirasaki | G09G 3/325 345/77 |
| 2007/0200804 A1* | 8/2007 | Kwon | G09G 3/2014 345/76 |
| 2010/0259527 A1* | 10/2010 | Odawara | G09G 3/3233 345/211 |

FOREIGN PATENT DOCUMENTS

| JP | 2007233326 A | 9/2007 |
| JP | 2008523448 A | 7/2008 |
| WO | WO-2009087746 A1 | 7/2009 |

OTHER PUBLICATIONS

Written Opinion of the International Searching Authority PCT/ISA/237 for International Application No. PCT/JP2014/072536 dated Dec. 2, 2014.

\* cited by examiner

Fig.16
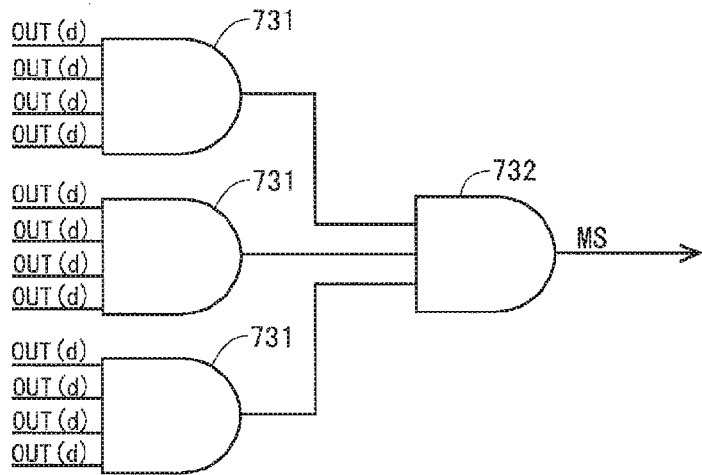
Fig.17
| INPUT | | OUTPUT | |
|---|---|---|---|
| IN(a) | IN(b) | OUT(c) | OUT(d) |
| 0 | 0 | 0 | 1 |
| 1 | 0 | 1 | 0 |
| 0 | 1 | 1 | 0 |
| 1 | 1 | 0 | 1 |
Fig.18
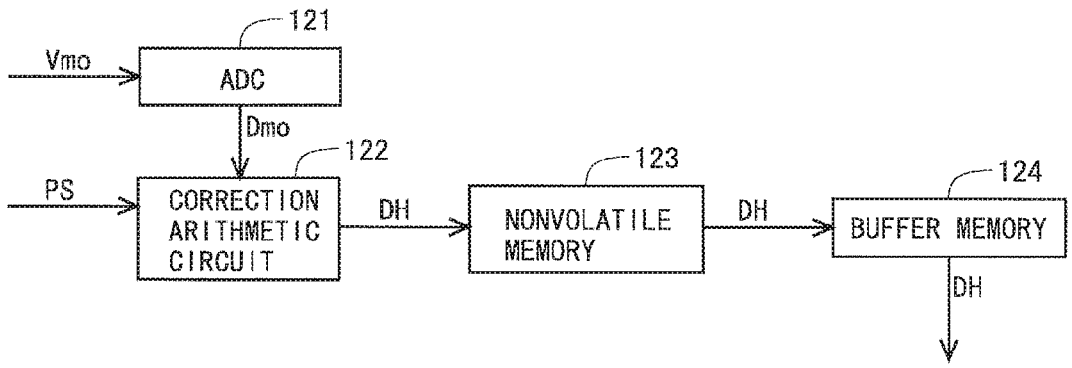

DISPLAY DEVICE AND METHOD FOR DRIVING SAME

TECHNICAL FIELD

The present invention relates to a display device and more particularly to a display device including self light-emitting type display elements which are driven by a current, such as an organic EL display device, and a method for driving the display device.

BACKGROUND ART

Conventionally, as display elements included in a display device, there are an electro-optical element whose luminance is controlled by a voltage applied thereto, and an electro-optical element whose luminance is controlled by a current flowing therethrough. A representative example of the electro-optical element whose luminance is controlled by a voltage applied thereto includes a liquid crystal display element. On the other hand, a representative example of the electro-optical element whose luminance is controlled by a current flowing therethrough includes an organic EL (Electro Luminescence) element. The organic EL element is also called an OLED (Organic Light-Emitting Diode). An organic EL display device using organic EL elements which are self light-emitting type electro-optical elements can easily achieve slimming down, a reduction in power consumption, an increase in luminance, etc., compared to a liquid crystal display device that requires a backlight, color filters, and the like. Therefore, in recent years, there has been active development of organic EL display devices.

As the driving system of an organic EL display device, there are known a passive matrix system (also called a simple matrix system) and an active matrix system. An organic EL display device adopting the passive matrix system is simple in structure, but is difficult to achieve size increase and definition improvement. On the other hand, an organic EL display device adopting the active matrix system (hereinafter, referred to as "active matrix-type organic EL display device") can easily achieve size increase and definition improvement, compared to the organic EL display device adopting the passive matrix system.

The active matrix-type organic EL display device has a plurality of pixel circuits formed in a matrix form. Each pixel circuit of the active matrix-type organic EL display device typically includes an input transistor that selects a pixel, and a drive transistor that controls the supply of a current to an organic EL element. Note that in the following the current flowing through the organic EL element from the drive transistor may be referred to as "drive current".

FIG. 37 is a circuit diagram showing a configuration of a conventional general pixel circuit 81. This pixel circuit 81 is provided corresponding to each of intersections of a plurality of data lines DL and a plurality of scanning lines SL which are disposed in a display portion. As shown in FIG. 37, this pixel circuit 81 is provided with two transistors T1 and T2, one capacitor Cst, and one organic EL element OLED. The transistor T1 is an input transistor, and the transistor T2 is a drive transistor.

The transistor T1 is provided between the data line DL and a gate terminal of the transistor T2. As for the transistor T1, a gate terminal is connected to the scanning line SL, and a source terminal is connected to the data line DL. The transistor T2 is provided in series with the organic EL element OLED. As for the transistor T2, a drain terminal is connected to a power supply line that supplies a high-level power supply voltage ELVDD, and a source terminal is connected to an anode terminal of the organic EL element OLED. It should be noted that, the power supply line that supplies the high-level power supply voltage ELVDD is referred to as a "high-level power supply line" in the following, and the high-level power supply line is added with the same symbol ELVDD as that of the high-level power supply voltage. As for the capacitor Cst, one end is connected to the gate terminal of the transistor T2, and the other end is connected to the source terminal of the transistor T2. It should be noted that the other end of the capacitor Cst may be connected to the drain terminal of the transistor T2. A cathode terminal of the organic EL element OLED is connected to a power supply line that supplies a low-level power supply voltage ELVSS. It should be noted that, the power supply line that supplies the low-level power supply voltage ELVSS is referred to as a "low-level power supply line" in the following, and the low-level power supply line is added with the same symbol ELVSS as that of the low-level power supply voltage. Further, here, a contact point of the gate terminal of the transistor T2, the one end of the capacitor Cst, and the drain terminal of the transistor T1 is referred to as a "gate node VG" for the sake of convenience. It is to be noted that, although one having a higher potential between a drain and a source is generally called a drain, in descriptions of the present specification, one is defined as a drain and the other is defined as a source, and hence a source potential may become higher than a drain potential.

FIG. 38 is a timing chart for explaining an operation of the pixel circuit 81 shown in FIG. 37. Before time t81, the scanning line SL is in a non-selected state. Therefore, before the time t81, the transistor T1 is in an off state, and a potential of the gate node VG is held at an initialization level (e.g., a level in accordance with writing in the last frame). At the time t81, the scanning line SL goes into a selected state and the transistor T1 is turned on. Thereby, a data voltage Vdata corresponding to a luminance of a pixel (sub-pixel) formed by this pixel circuit 81 is supplied to the gate node VG via the data line DL and the transistor T1. Thereafter, in a period till time t82, the potential of the gate node VG changes in accordance with the data voltage Vdata. At this time, the capacitor Cst is charged with a gate-source voltage Vgs which is a difference between the potential of the gate node VG and a source potential of the transistor T2. At the time t82, the scanning line SL goes into the non-selected state. Thereby, the transistor T1 is turned off and the gate-source voltage Vgs held by the capacitor Cst is determined. The transistor T2 supplies a drive current to the organic EL element OLED in accordance with the gate-source voltage Vgs held by the capacitor Cst. As a result, the organic EL element OLED emits light with a luminance in accordance with the drive current.

Meanwhile, the organic EL display device typically adopts a thin film transistor (TFT) as a drive transistor. However, the thin film transistor is likely to have variations in characteristics (threshold voltage and mobility). When variations occur in characteristics of the drive transistors provided in the display unit, variations occur in the magnitudes of drive currents. As a result, luminance nonuniformity occurs on a display screen. Hence, in order to suppress the occurrence of luminance nonuniformity on the display screen in the organic EL display device, there is a need to compensate for variations in the characteristics of the drive transistors.

In view of this, regarding the organic EL display device, there are conventionally proposed techniques for compensating for variations in the characteristics of the drive transistors. For example, Japanese Patent Application Laid-Open No. 2007-233326 discloses an external compensation technique that enables image display with a uniform luminance regardless of the characteristics (threshold voltage and mobility) of drive transistors. In the technique disclosed in Japanese Patent Application Laid-Open No. 2007-233326, a drive current is read and control according to a result of comparison between the drive current and a data current is performed.

PRIOR ART DOCUMENT

Patent Document

[Patent Document 1] Japanese Patent Application Laid-Open No. 2007-233326

SUMMARY OF THE INVENTION

Problems to be Solved by the Invention

Meanwhile, in order to enable drive current measurement to perform compensation according to the characteristics of a drive transistor, it is considered to configure a pixel circuit as shown in FIG. 39. A pixel circuit 91 shown in FIG. 39 is provided with a transistor T3 for controlling whether to perform drive current measurement, in addition to components provided conventionally. When the transistor T3 is in an on state, a drive current is read through a data line DL. In addition, a display unit is provided with a signal line for controlling the on/off of the transistor T3, in parallel with a scanning line. For convenience of description, a signal line corresponding to the scanning line which is provided conventionally is hereinafter referred to as "write control line", and the signal line for controlling the on/off of the transistor T3 is hereinafter referred to as "monitoring control line". The write control line is denoted by reference character G1_WL and the monitoring control line is denoted by reference character G2_Moni.

In a configuration such as that described above, to minimize the influence on a display image, it is considered, for example, to perform drive current measurement for one row per one frame. One row that is targeted for drive current measurement in each frame is hereinafter referred to as a "compensation target row". In addition, in this specification, for convenience of description, the first row is referred to as the "0th row". In a frame in which an nth row is the compensation target row, write control lines G1_WL and monitoring control lines G2_Moni are driven as shown in FIG. 40. In FIG. 40, a period before time point t91 and a period after time point t94 are periods for performing processes on rows other than the compensation target row. During the period before time point t91 and the period after time point t94, a normal data write is performed. Therefore, the period before time point t91 and the period after time point t94 are hereinafter referred to as "normal operating periods". In FIG. 40, a period from time point t91 to time point t94 is a period for performing a process on the compensation target row. During the period from time point t91 to time point t94, a process of measuring a drive current to detect characteristics of each drive transistor is performed. Therefore, the period from time point t91 to time point t94 is hereinafter referred to as "characteristic detection processing period". Note that the length of the characteristic detection processing period is typically a length corresponding to five to six horizontal scanning periods.

As can be grasped from FIG. 40, during the normal operating period, the write control lines G1_WL sequentially go into a selected state for one horizontal scanning period. On the other hand, during the characteristic detection processing period, a write control line G1_WL(n) of the compensation target row needs to go into a selected state twice. Specifically, the write control line G1_WL(n) of the compensation target row needs to go into a selected state at the beginning and end of the characteristic detection processing period. Note that during the characteristic detection processing period, a process such as that shown below is performed on the compensation target row. During a period from time point t91 to time point t92, data for drive current measurement (hereinafter, referred to as "pre-compensation data") is written. During a period from time point t92 to time point t93, drive current measurement is performed. During a period from time point t93 to time point t94, data for image display (hereinafter, referred to as "post-compensation data") is written. In the configuration shown in FIG. 39, since a drive current is read through the transistor T3, the monitoring control line G2_Moni(n) is brought into a selected state during the period from time point t92 to time point t93.

The above-described compensation target row varies frame by frame. Thus, for example, in a frame in which the fifth row is set as the compensation target row, a write control line G1_WL(5) of the fifth row needs to go into a selected state twice, and for example, in a frame in which the tenth row is set as the compensation target row, a write control line G1_WL(10) of the tenth row needs to go into a selected state twice. As such, complex operation is required to perform drive current measurement row-by-row in one frame.

Note that the write control line G1_WL and the monitoring control line G2_Moni both are connected to gate terminals of transistors in the pixel circuit 91. Thus, in this specification, a drive circuit for the write control lines and a drive circuit for the monitoring control lines are collectively referred to as "gate driver circuits".

Meanwhile, in recent years, adoption of a TFT containing InGaZnO (a compound composed of indium (In), gallium (Ga), zinc (Zn), and oxygen (O)) (indium gallium zinc oxide) has been increasing due to reasons such as "leakage current is very small", "mobility is relatively high", and "achievement of high definition is possible". However, in a manufacturing process using InGaZnO, P-channel TFTs cannot be formed on a substrate. Therefore, in order to make the gate driver circuits monolithic, the circuits need to be implemented using TFTs of only an N-channel type. However, it is very difficult for the gate driver circuits formed using TFTs of only an N-channel type to implement complex operation such as that described above.

An object of the present invention is therefore to achieve compensation for variations in the characteristics of drive transistors in a display device that includes current-driven self light-emitting type display elements and that adopts gate driver circuits formed of single-channel TFTs.

Means for Solving the Problems

A first aspect of the present invention is directed to a display device having a plurality of pixel circuits formed in a matrix form, each of the pixel circuits including an electrooptical element whose luminance is controlled by a current; and a drive transistor configured to control a current to be supplied to the electrooptical element, the display device including:

a plurality of write control lines provided for respective rows and configured to control whether to write data voltages into the pixel circuits of the corresponding rows;

a plurality of monitoring control lines provided for the respective rows and configured to control whether to measure drive currents to be supplied to the drive transistors included in the pixel circuits of the corresponding rows;

a plurality of data lines provided for respective columns and configured to supply the data voltages to the pixel circuits of the corresponding columns;

a write control line drive circuit including a first shift register that includes a plurality of first unit circuits having a one-to-one correspondence with the plurality of write control lines and that operates based on a first clock signal group, and configured to bring a write control line corresponding to a first unit circuit being in an active state into a selected state, the first shift register being configured such that the plurality of first unit circuits sequentially go into an active state based on the first clock signal group;

a monitoring control line drive circuit configured to bring a monitoring control line corresponding to a measurement target row into a selected state, the measurement target row being a row targeted for drive current measurement;

a data line drive circuit configured to apply the data voltages to the plurality of data lines;

a current measurement circuit configured to measure drive currents supplied from the plurality of pixel circuits;

a drive control unit configured to control operation of the write control line drive circuit, the monitoring control line drive circuit, the data line drive circuit, and the current measurement circuit;

a correction data calculation and storage unit configured to calculate correction data for correcting grayscale data corresponding to display grayscales of the respective pixel circuits, based on the drive currents measured by the current measurement circuit, and to hold the correction data; and a grayscale correcting unit configured to obtain data voltages to be written into the respective pixel circuits by correcting the grayscale data based on the correction data held in the correction data calculation and storage unit, wherein the plurality of first unit circuits are formed using transistors of only one of an N-channel type and a P-channel type, the plurality of second unit circuits are formed using transistors of only one of the N-channel type and the P-channel type that is a same type as the transistors forming the plurality of first unit circuits, the monitoring control line drive circuit includes a second shift register that includes a plurality of second unit circuits having a one-to-one correspondence with the plurality of monitoring control lines and that operates based on a second clock signal group and a monitoring enabling signal, and brings a monitoring control line corresponding to a second unit circuit being in an active state into a selected state when the monitoring enabling signal is active, the second shift register being configured such that the plurality of second unit circuits sequentially go into an active state based on the second clock signal group;

one row is set as the measurement target row per frame period, the drive control unit includes:
a clock counter configured to count numbers of clock pulses of the first clock signal group;
a measurement target address value storage unit configured to hold a measurement target address value indicating the measurement target row; and a matching determination circuit configured to determine whether a value of the clock counter matches the measurement target address value, a predetermined period from a time point that is one clock period after a time point where the matching determination circuit determines that the value of the clock counter matches the measurement target address value is set as a current measurement period during which drive current measurement by the current measurement circuit is performed, and the drive control unit:
controls the first clock signal group such that only a potential of one of clock signals that is provided to a first unit circuit corresponding to the measurement target row changes at a start time point and an end time point of the current measurement period, and that clock operation performed by the first clock signal group stops throughout the current measurement period, the clock signals being included in the first clock signal group;

controls the second clock signal group such that after potentials of clock signals included in the second clock signal group change at the start time point of the current measurement period, clock operation performed by the second clock signal group stops throughout the current measurement period; and makes the monitoring enabling signal active only during the current measurement period.

According to a second aspect of the present invention, in the first aspect of the present invention, each of the second unit circuits includes:
a first output terminal connected to a preceding stage and a subsequent stage and configured to output a state signal indicating an internal state;
a second output terminal connected to a corresponding monitoring control line; and
an output control transistor having a control terminal to which the monitoring enabling signal is provided; a first conduction terminal connected to the first output terminal; and a second conduction terminal connected to the second output terminal.

According to a third aspect of the present invention, in the second aspect of the present invention, the display device further includes a level shifter circuit configured to convert a voltage level of the monitoring enabling signal provided to the control terminal of the output control transistor.

According to a fourth aspect of the present invention, in the first aspect of the present invention, the current measurement circuit performs drive current measurement based on a first grayscale and drive current measurement based on a second grayscale, the drive control unit further includes a grayscale identification counter configured to identify whether the drive current measurement based on the first grayscale is performed or the drive current measurement based on the second grayscale is performed in each frame period, and the correction data calculation and storage unit calculates the correction data based on two types of drive currents measured by the current measurement circuit, with reference to a value of the grayscale identification counter.

According to a fifth aspect of the present invention, in the fourth aspect of the present invention, in two consecutive frame periods, the drive current measurement based on the first grayscale and the drive current measurement based on the second grayscale are performed for pixel circuits of a same row.

According to a sixth aspect of the present invention, in the first aspect of the present invention, the value of the clock counter and the measurement target address value are represented by a same number of bits, and the matching determination circuit includes:
- a plurality of exclusive-OR circuits each configured to output an exclusive-OR of corresponding bits of the value of the clock counter and the measurement target address value;
- a plurality of NOT circuits provided so as to have a one-to-one correspondence with the plurality of exclusive-OR circuits, and configured to output NOTs of the outputs from the corresponding exclusive-OR circuits; and
- an AND circuit configured to output an AND of the outputs from the plurality of NOT circuits.

According to a seventh aspect of the present invention, in the first aspect of the present invention, the value of the clock counter and the measurement target address value are represented by a same number of bits, and the matching determination circuit includes:
- a plurality of exclusive-OR circuits each configured to output an exclusive-OR of corresponding bits of the value of the clock counter and the measurement target address value; and
- a NOT-OR circuit configured to output a NOR of the outputs from the plurality of exclusive-OR circuits.

According to an eighth aspect of the present invention, in the first aspect of the present invention, each of the first unit circuits and each of the second unit circuits includes:
- a first node;
- a first output terminal configured to output a state signal indicating an internal state;
- a first transistor having a control terminal and a first conduction terminal to which a state signal outputted from a preceding stage is provided, and a second conduction terminal connected to the first node;
- a second transistor having a control terminal connected to the first node; a first conduction terminal to which a control clock signal is provided; and a second conduction terminal connected to the first output terminal;
- a third transistor having a control terminal to which a state signal outputted from a subsequent stage is provided; a first conduction terminal connected to the first output terminal; and a second conduction terminal to which an off-level direct-current power supply voltage is provided; and
- a fourth transistor having a control terminal to which a state signal outputted from a subsequent stage is provided; a first conduction terminal connected to the first node; and a second conduction terminal to which the off-level direct-current power supply voltage is provided, one signal included in the first clock signal group is provided as the control clock signal to the first conduction terminal of the second transistor included in each of the first unit circuits, one signal included in the second clock signal group is provided as the control clock signal to the first conduction terminal of the second transistor included in each of the second unit circuits, the first output terminal included in each of the first unit circuits is connected to a corresponding write control line, and each of the second unit circuits further includes:
- a second output terminal connected to a corresponding monitoring control line; and
- an output control transistor having a control terminal to which the monitoring enabling signal is provided; a first conduction terminal connected to the first output terminal; and a second conduction terminal connected to the second output terminal.

According to a ninth aspect of the present invention, in the first aspect of the present invention, transistors forming the plurality of first unit circuits and the plurality of second unit circuits are thin film transistors containing indium gallium zinc oxide.

A tenth aspect of the present invention is directed to a method for driving a display device having a plurality of pixel circuits formed in a matrix form, each of the pixel circuits including an electrooptical element whose luminance is controlled by a current; and a drive transistor configured to control a current to be supplied to the electrooptical element, the method including:
- a drive controlling step of controlling drive operation of the display device;
- a current measuring step of measuring drive currents to be supplied to the drive transistors included in the respective pixel circuits;
- a correction data calculating step of calculating correction data for correcting grayscale data corresponding to display grayscales of the respective pixel circuits, based on the drive currents measured in the current measuring step; and
- a grayscale correcting step of obtaining data voltages to be written into the respective pixel circuits by correcting the grayscale data based on the correction data calculated in the correction data calculating step, wherein the display device includes:
- a plurality of write control lines provided for respective rows and configured to control whether to write the data voltages into the pixel circuits of the corresponding rows;
- a plurality of monitoring control lines provided for the respective rows and configured to control whether to measure drive currents to be supplied to the drive transistors included in the pixel circuits of the corresponding rows;
- a plurality of data lines provided for respective columns and configured to supply the data voltages to the pixel circuits of the corresponding columns;
- a write control line drive circuit including a first shift register that includes a plurality of first unit circuits having a one-to-one correspondence with the plurality of write control lines and that operates based on a first clock signal group, and configured to bring a write control line corresponding to a first unit circuit being in an active state into a selected state, the first shift register being configured such that the plurality of first unit circuits sequentially go into an active state based on the first clock signal group; and
- a monitoring control line drive circuit configured to bring a monitoring control line corresponding to a measurement target row into a selected state, the measurement target row being a row targeted for drive current measurement, the plurality of first unit circuits are formed using transistors of only one of an N-channel type and a P-channel type, the plurality of second unit circuits are formed using transistors of only one of the N-channel type and the P-channel type that is a same type as the transistors forming the plurality of first unit circuits, the monitoring control line drive circuit includes a second shift register that includes a plurality of second unit circuits having a one-to-one correspondence with the plurality of monitoring control lines and that operates based on a second clock signal group and a monitoring enabling signal, and brings a monitoring control line corresponding to a second unit circuit being in an active state into a selected state when the monitoring enabling signal is active, the second shift register being configured such that the plurality of second unit circuits sequentially go into an active state based on the second clock signal group;

one row is set as the measurement target row per frame period, the drive controlling step includes:
a clock pulse counting step of counting numbers of clock pulses of the first clock signal group; and
a matching determining step of determining whether a value counted in the clock pulse counting step matches a measurement target address value indicating the measurement target row,
a predetermined period from a time point that is one clock period after a time point where it is determined in the matching determining step that the value counted in the clock pulse counting step matches the measurement target address value is set as a current measurement period during which drive current measurement in the current measuring step is performed, and in the drive controlling step,
the first clock signal group is controlled such that only a potential of one of clock signals that is provided to a first unit circuit corresponding to the measurement target row changes at a start time point and an end time point of the current measurement period, and that clock operation performed by the first clock signal group stops throughout the current measurement period, the clock signals being included in the first clock signal group;
the second clock signal group is controlled such that after potentials of clock signals included in the second clock signal group change at the start time point of the current measurement period, clock operation performed by the second clock signal group stops throughout the current measurement period; and
the monitoring enabling signal is made active only during the current measurement period.

Effects of the Invention

According to the first aspect of the present invention, in the drive control unit there is provided the matching determination circuit that determines whether the number of clock pulses of a first clock signal group which controls the operation of the write control line drive circuit matches a measurement target address value indicating a measurement target row. Then, if the number of clock pulses of a first clock signal group matches the measurement target address value indicating a measurement target row, the drive control unit stops clock operation performed by the first clock signal group for a predetermined period (current measurement period) from a time point that is one clock period after a time point where they match each other. In addition, at the start time point and end time point of the current measurement period, the drive control unit changes only a potential of one of clock signals that is provided to a first unit circuit corresponding to the measurement target row, the clock signals being included in the first clock signal group. By this, a write control line of the measurement target row goes into a selected state during periods immediately before and immediately after the current measurement period. In addition, the monitoring control line drive circuit is configured to bring a monitoring control line corresponding to a second unit circuit being in an active state into a selected state when a monitoring enabling signal is active. Here, the drive control unit stops clock operation performed by a second clock signal group for a predetermined period (current measurement period) from a time point that is one clock period after a time point where the number of clock pulses of the first clock signal group matches the measurement target address value indicating a measurement target row. By this, in each frame period, a monitoring control line of a measurement target row goes into a selected state during the current measurement period, and all monitoring control lines are maintained in a non-selected state during other periods. By driving the write control lines and the monitoring control lines in the above-described manner, in each frame period, drive current measurement for detecting characteristics of drive transistors is performed. Then, correction data is obtained based on the measured values of drive currents, and grayscale data is corrected based on the correction data. As a result, variations in the characteristics of the drive transistors are compensated for. Here, the shift registers in the gate driver circuits (the write control line drive circuit and the monitoring control line drive circuit) that implement the above-described operation are formed using transistors of only one of an N-channel type and a P-channel type. By the above, it becomes possible to compensate for variations in the characteristics of drive transistors in a display device that includes current-driven self light-emitting type display elements and that adopts gate driver circuits formed of single-channel transistors. Meanwhile, the gate driver circuits that perform complex operation to enable drive current measurement such as that described above are generally implemented by CMOS logic circuits. Hence, according to conventional art, when transistors other than polysilicon TFTs are adopted as transistors composing the gate driver circuits, the gate driver circuits that perform complex operation cannot be formed on a glass substrate. Therefore, the gate driver circuits need to be mounted on a glass substrate in IC chip form. Regarding this point, according to the first aspect of the present invention, complex operation is implemented by gate driver circuits formed using single-channel transistors. Hence, the gate driver circuits can be formed on a glass substrate without being formed in IC form. As a result, a reduction in the cost of a display device is achieved.

According to the second aspect of the present invention, the monitoring control line drive circuit capable of bringing a monitoring control line into a selected state only during the current measurement period is implemented by a relatively simple configuration.

According to the third aspect of the present invention, it becomes possible to securely increase the level of a voltage provided to the control terminal of the output control transistor to a level sufficient to bring the monitoring control line into a selected state.

According to the fourth aspect of the present invention, it becomes possible for the correction data calculation and storage unit to identify whether a measured value of a drive current provided from the current measurement circuit is a value based on the first grayscale or a value based on the second grayscale. Hence, calculation of correction data is securely performed based on two types of drive currents.

According to the fifth aspect of the present invention, a grayscale identification counter does not need to be provided for each row, and only one grayscale identification counter needs to be provided for the entire device.

According to the sixth aspect of the present invention, the same effects as those of the first aspect of the present invention can be obtained with a display device including a matching determination circuit including a plurality of exclusive-OR circuits, a plurality of NOT circuits, and an AND circuit.

According to the seventh aspect of the present invention, the same effects as those of the first aspect of the present invention can be obtained with a display device including a matching determination circuit including a plurality of exclusive-OR circuits and a NOT-OR circuit.

According to the eighth aspect of the present invention, the same effects as those of the first aspect of the present invention can be obtained without making the configurations of the first unit circuits and the second unit circuits complex.

According to the ninth aspect of the present invention, the same effects as those of the first aspect of the present invention can be obtained while high definition and a reduction in power consumption are achieved.

According to the tenth aspect of the present invention, the same effects as those of the first aspect of the present invention can be provided by an invention of a method for driving a display device.

BRIEF DESCRIPTION OF THE DRAWINGS

FIG. 16 is a logic circuit diagram showing one exemplary configuration for a case in which the number of pieces of data inputted to an AND circuit is large in the embodiment.

FIG. 17 is a diagram showing a truth table for when focusing on a configuration for one bit in the matching circuit shown in FIG. 15 in the embodiment.

FIG. 18 is a block diagram showing a detailed configuration of a correction data calculation and storage unit in the display control circuit in the embodiment.

MODE FOR CARRYING OUT THE INVENTION

An embodiment of the present invention will be described below with reference to the accompanying drawings. Note that for each transistor, a gate terminal corresponds to a control terminal, a drain terminal corresponds to a first conduction terminal, and a source terminal corresponds to a second conduction terminal.

<1. Overall Configuration and Summary of Operation>

Figure 2:
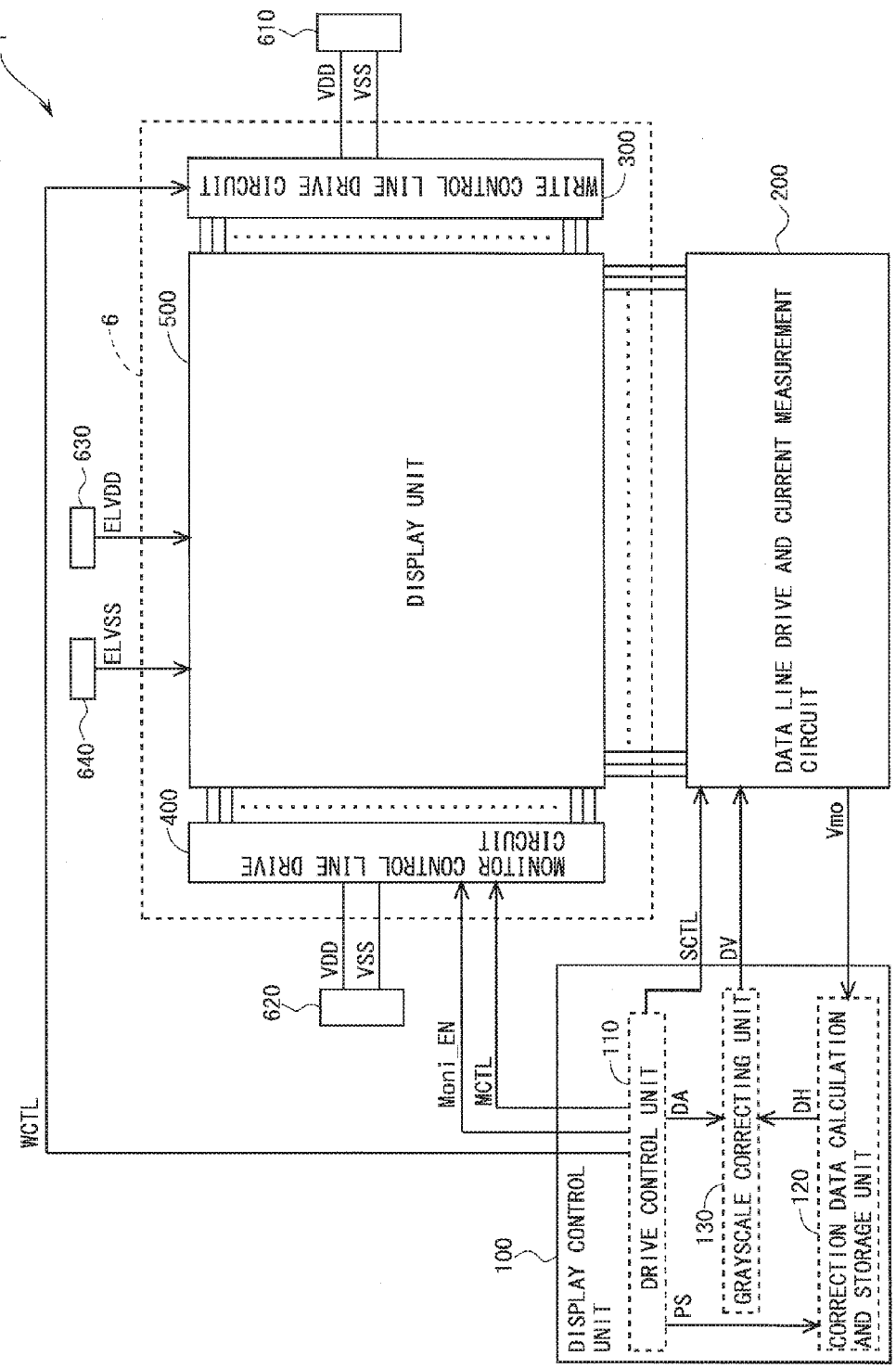
FIG. 2 is a block diagram showing an overall configuration of the organic EL display device in the embodiment.
Figure 3:
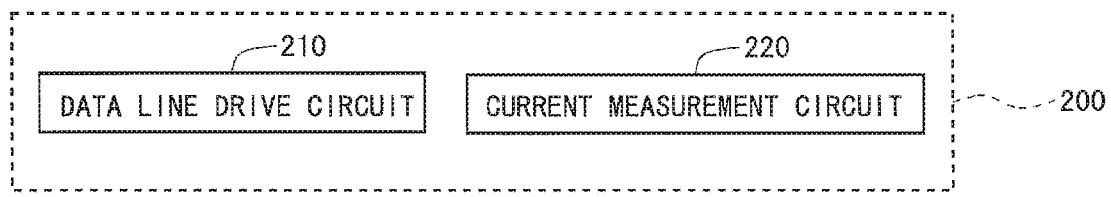
FIG. 3 is a diagram for describing an outline of a data line drive and current measurement circuit in the embodiment.

FIG. 2 is a block diagram showing an overall configuration of an active matrix-type organic EL display device 1 according to one embodiment of the present invention. The organic EL display device 1 includes a display control circuit 100, a data line drive and current measurement circuit 200, a write control line drive circuit 300, a monitoring control line drive circuit 400, and a display unit 500. As shown in FIG. 3, the data line drive and current measurement circuit 200 includes a portion that functions as a data line drive circuit 210 and a portion that functions as a current measurement circuit 220. Note that in the present embodiment, the write control line drive circuit 300 and the monitoring control line drive circuit 400 are formed in an organic EL panel 6 including the display unit 500. That is, the write control line drive circuit 300 and the monitoring control line drive circuit 400 are made monolithic. In addition, the organic EL display device 1 is provided with a logic power supply 610, a logic power supply 620, an organic EL high-level power supply 630, and an organic EL low-level power supply 640 as components for supplying various types of power supply voltages to the organic EL panel 6.

A high-level power supply voltage VDD and a low-level power supply voltage VSS which are required for the operation of the write control line drive circuit 300 are supplied to the organic EL panel 6 from the logic power supply 610. A high-level power supply voltage VDD and a low-level power supply voltage VSS which are required for the operation of the monitoring control line drive circuit 400 are supplied to the organic EL panel 6 from the logic power supply 620. A high-level power supply voltage ELVDD which is a constant voltage is supplied to the organic EL panel 6 from the organic EL high-level power supply 630. A low-level power supply voltage ELVSS which is a constant voltage is supplied to the organic EL panel 6 from the organic EL low-level power supply 640.

Figure 4:
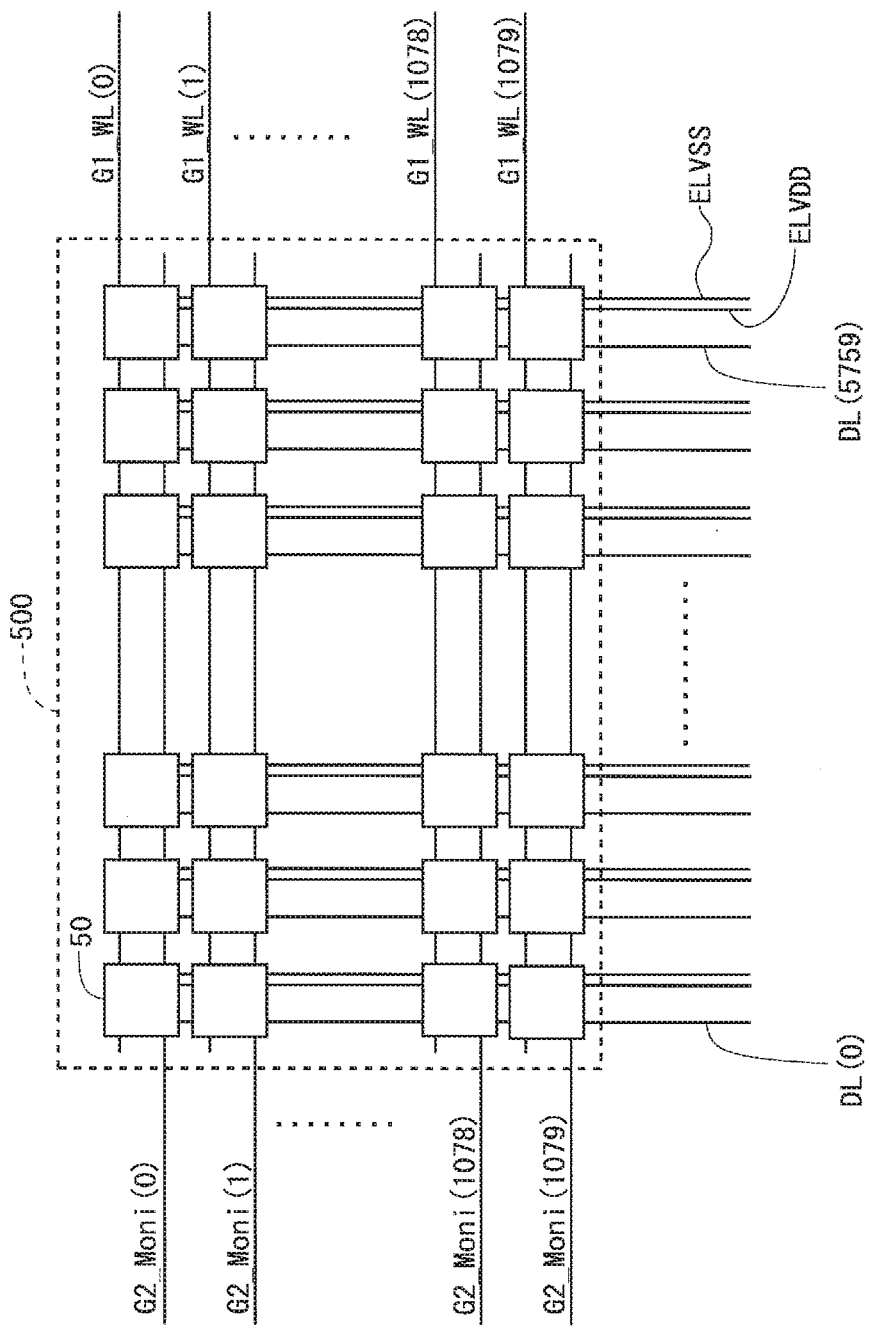
FIG. 4 is a diagram for describing a configuration of a display unit in the embodiment.

FIG. 4 is a diagram for describing a configuration of the display unit 500 in the present embodiment. Note that in this specification a description is made assuming that the organic EL panel 6 is a full high vision panel. Note, however, that the present invention is not limited thereto. As shown in FIG. 4, in the display unit 500, 1080 write control lines G1_WL(0) to G1_WL(1079) and 5760 data lines DL(0) to DL(5759) are disposed so as to intersect each other. For the data lines DL(0) to DL(5759), a red-pixel data line, a green-pixel data line, and a blue-pixel data line are sequentially disposed. Pixel circuits 50 are provided at the respective intersections of the write control lines G1_WL(0) to G1_WL(1079) and the data lines DL(0) to DL(5759). That is, in the display unit 500 the pixel circuits 50 are formed in a matrix form so as to form a plurality of rows (1080 rows) and a plurality of columns (5760 columns). Note that, as described above, in this specification the first row is referred to as the "0th row". That is, the 1080 rows are referred to as the 0th row to the 1079th row, respectively. Likewise, the 5760 columns are referred to as the 0th column to the 5759th column, respectively. In the display unit 500, 1080 monitoring control lines G2_Moni(0) to G2_Moni(1079) are also disposed so as to have a one-to-one correspondence with the 1080 write control lines G1_WL(0) to G1_WL(1079). Furthermore, in the display unit 500 high-level power supply lines ELVDD and low-level power supply lines ELVSS are disposed. A specific configuration of the pixel circuits 50 will be described later.

Note that in the following, when the 1080 write control lines G1_WL(0) to G1_WL(1079) do not need to be distinguished from each other, the write control lines are simply represented by reference character G1_WL. Likewise, the monitoring control lines and the data lines are simply represented by reference character G2_Moni and reference character DL, respectively.

As shown in FIG. 2, the display control circuit 100 functionally has a drive control unit 110, a correction data calculation and storage unit 120, and a grayscale correcting unit 130. The drive control unit 110 outputs a write control signal WCTL for controlling the operation of the write control line drive circuit 300, a monitoring control signal MCTL and a monitoring enable signal Moni_EN for controlling the operation of the monitoring control line drive circuit 400, and a source control signal SCTL for controlling the operation of the data line drive and current measurement circuit 200. The write control signal WCTL includes a start pulse signal GSP, a clock signal CLK1, and a clock signal CLK2 which will be described later. The monitoring control signal MCTL includes a start pulse signal MSP, a clock signal CLK3, and a clock signal CLK4 which will be described later. The source control signal SCTL includes a start pulse signal SSP, a clock signal SCK, a latch strobe signal LS, and an input/output control signal DWT which will be described later. Note that the monitoring enable signal Moni_EN is a signal for controlling whether to enable drive current measurement. The drive control unit 110 also outputs data signals DA and a grayscale position instruction signal PS which will be described later, within the display control circuit 100. The correction data calculation and storage unit 120 holds correction data to be used to correct the data signals DA. The correction data is composed of an offset value and a gain value. The correction data calculation and storage unit 120 receives the grayscale position instruction signal PS and a monitored voltage Vmo which is a result of current measurement by the data line drive and current measurement circuit 200, and performs an update to the correction data. The grayscale correcting unit 130 corrects the data signals DA outputted from the drive control unit 110, using correction data DH held in the correction data calculation and storage unit 120, and outputs data obtained by the correction, as digital video signals DV. A more detailed description of the components in the display control circuit 100 will be made later.

Note that in the present embodiment a first clock signal group is implemented by the clock signal CLK1 and the clock signal CLK2, a second clock signal group is implemented by the clock signal CLK3 and the clock signal CLK4, and a monitoring enabling signal is implemented by the monitoring enable signal Moni_EN.

The data line drive and current measurement circuit 200 selectively performs the operation of driving the data lines DL(0) to DL(5759) (operation of the data line drive circuit 210) and the operation of measuring drive currents outputted to the data lines DL(0) to DL(5759) from the pixel circuits 50 (operation of the current measurement circuit 220). Note that, as described above, the correction data calculation and storage unit 120 holds an offset value and a gain value as correction data. To implement this, the data line drive and current measurement circuit 200 performs drive current measurement based on two types of grayscales (a first grayscale P1 and a second grayscale P2: P2>P1).

Figure 5:
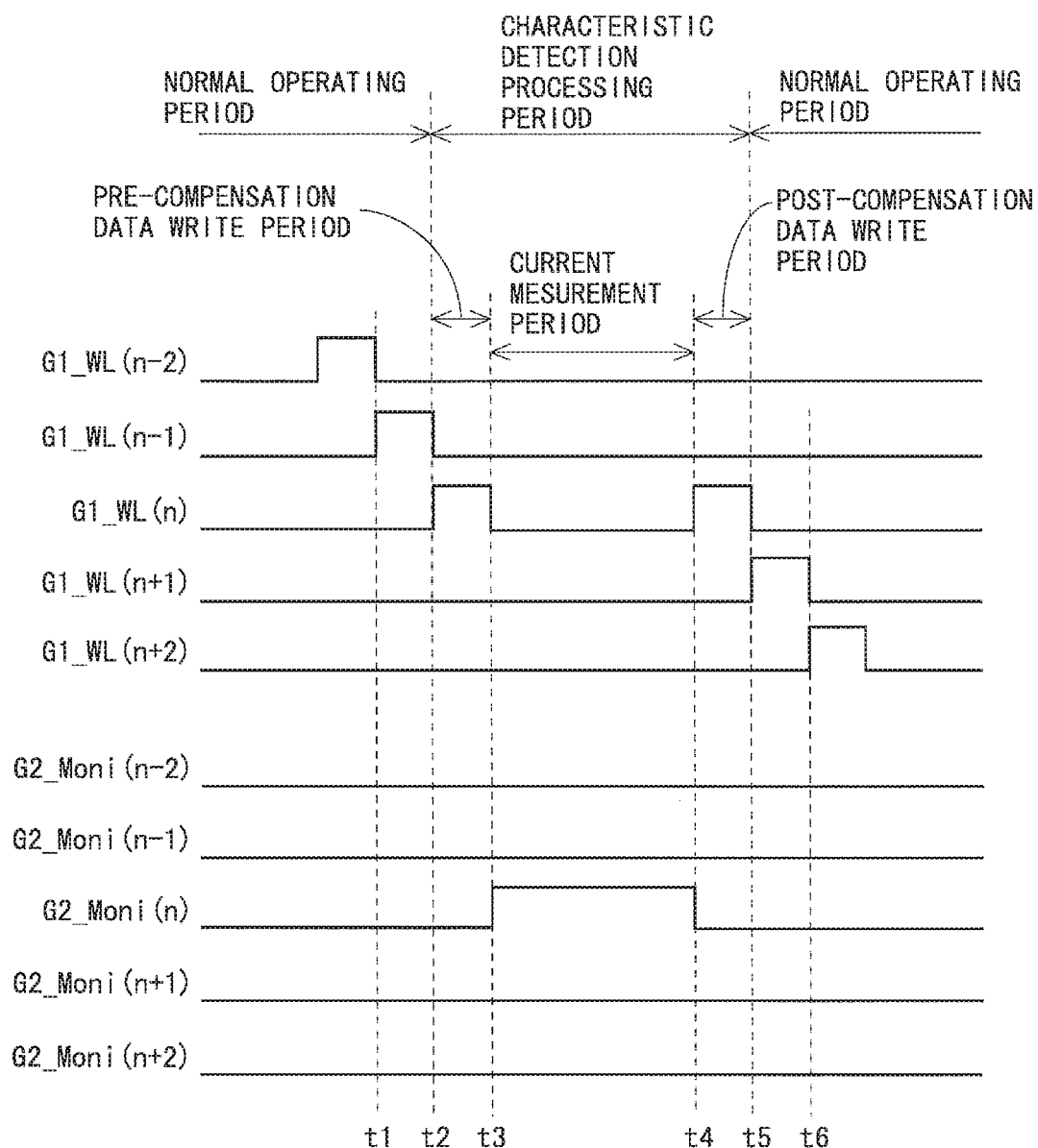
FIG. 5 is a timing chart for describing drive of write control lines and monitoring control lines in the embodiment.

The write control line drive circuit 300 drives the 1080 write control lines G1_WL(0) to G1_WL(1079), based on the write control signal WCTL transmitted from the display control circuit 100. The monitoring control line drive circuit 400 drives the 1080 monitoring control lines G2_Moni(0) to G2_Moni(1079), based on the monitoring control signal MCTL and monitoring enable signal Moni_EN which are transmitted from the display control circuit 100. In a frame in which an nth row is set as a compensation target row (measurement target row), the write control lines G1_WL and the monitoring control lines G2_Moni are driven as shown in FIG. 5. In FIG. 5, a period before time point t2 and a period after time point t5 are normal operating periods, and a period from time point t2 to time point t5 is a characteristic detection processing period. The same also applies to FIGS. 26 to 28. During the normal operating period, the write control lines G1_WL sequentially go into a selected state for one horizontal scanning period. In addition, during the normal operating period, all of the monitoring control lines G2_Moni are maintained in a non-selected state. The characteristic detection processing period is composed of a pre-compensation data write period during which pre-compensation data (data for drive current measurement) is written; a current measurement period during which drive current measurement is performed; and a post-compensation data write period during which post-compensation data (data for image display) is written. During the pre-compensation data write period and the post-compensation data write period, the write control line G1_WL(n) of the compensation target row goes into a selected state. In addition, during the current measurement period, the monitoring control line G2_Moni(n) of the compensation target row goes into a selected state. How drive such as that described above is implemented in the present embodiment will be described later.

By each component operating in the above-described manner to drive the data lines DL(0) to DL(5759), the write control lines G1_WL(0) to G1_WL(1079), and the monitoring control lines G2_Moni(0) to G2_Moni(1079), an image is displayed on the display unit 500. At that time, since data signals DA are corrected based on measurement results of drive currents, variations in the characteristics of drive transistors are compensated for.

<2. Pixel Circuits and Data Line Drive and Current Measurement Circuit>

The data line drive and current measurement circuit 200 performs operation such as that shown below when functioning as the data line drive circuit 210. The data line drive and current measurement circuit 200 receives the source control signal SCTL transmitted from the display control circuit 100, and applies drive video signals to the data lines DL(0) to DL(5759). At this time, the data line drive and current measurement circuit 200 sequentially holds digital video signals DV representing voltages to be applied to the respective data lines DL, triggered by a pulse of the start pulse signal SSP, at the timing of occurrence of a pulse of the clock signal SCK. Then, the held digital video signals DV are converted into analog voltages at the timing of occurrence of a pulse of the latch strobe signal LS. The converted analog voltages are simultaneously applied to all of the data lines DL(0) to DL(5759), as drive video signals. When the data line drive and current measurement circuit 200 functions as the current measurement circuit 220, the data line drive and current measurement circuit 200 outputs monitored voltages Vmo generated according to drive currents which are outputted to the data lines DL(0) to DL(5759) from the pixel circuits 50.

Figure 6:
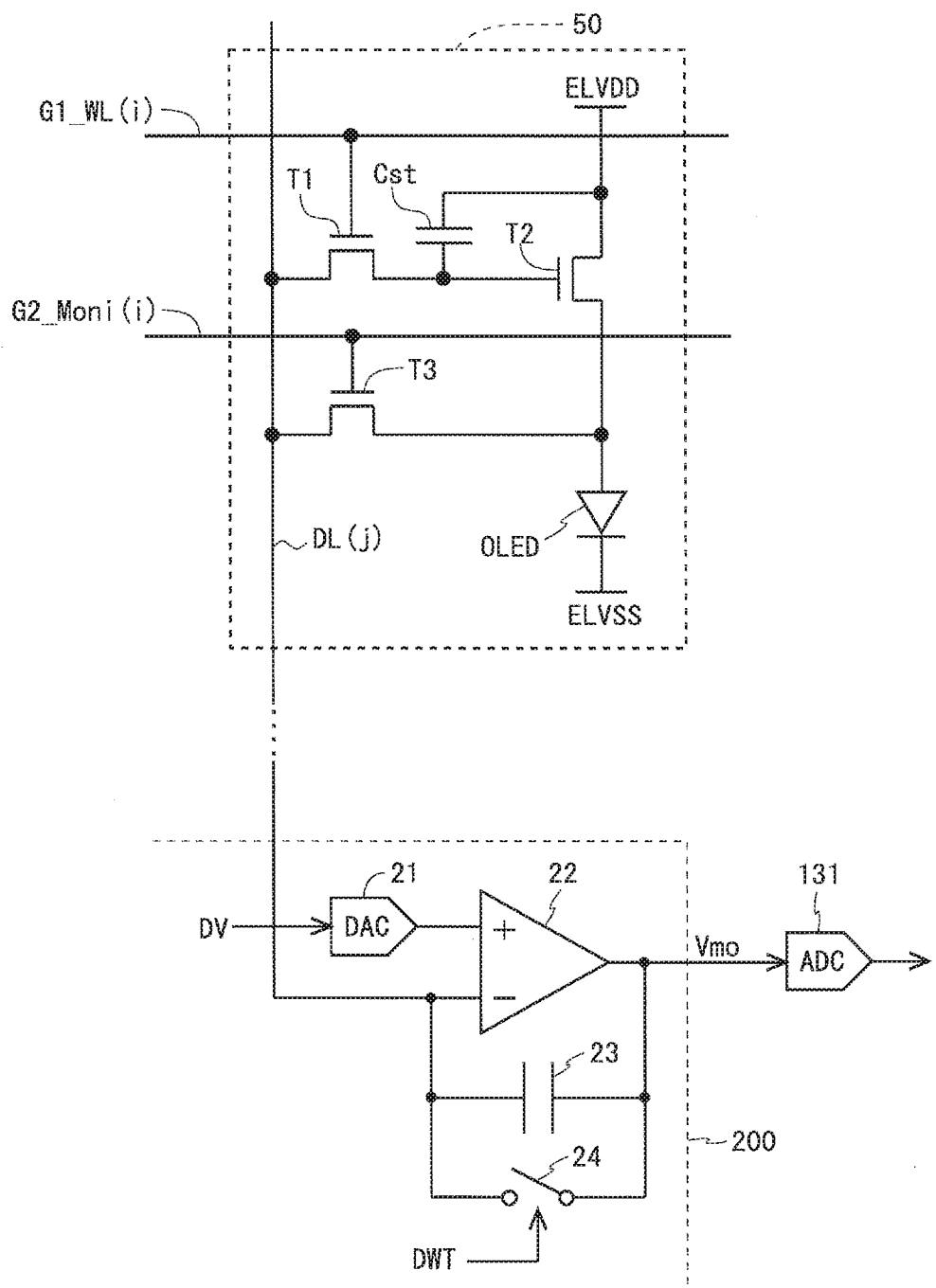
FIG. 6 is a circuit diagram showing a pixel circuit and a part of the data line drive and current measurement circuit in the embodiment.

FIG. 6 is a circuit diagram showing a pixel circuit 50 and a part of the data line drive and current measurement circuit 200. FIG. 6 shows a pixel circuit 50 at an ith row and a jth column and a portion of the data line drive and current measurement circuit 200 corresponding to a data line DL(j) of the jth column. The pixel circuit 50 includes one organic EL element (electrooptical element) OLED, three transistors T1 to T3, and one capacitor Cst. The transistor T1 functions as an input transistor that selects a pixel, the transistor T2 functions as a drive transistor that controls the supply of a current to the organic EL element OLED, and the transistor T3 functions as a monitoring control transistor that controls whether to perform current measurement for detecting characteristics of the drive transistor.

The transistor T1 is provided between the data line DL (j) and the gate terminal of the transistor T2. For the transistor T1, the gate terminal is connected to a write control line G1_WL(i) and the source terminal is connected to the data line DL(j). The transistor T2 is provided in series with the organic EL element OLED. For the transistor T2, the gate terminal is connected to the drain terminal of the transistor T1, the drain terminal is connected to a high-level power supply line ELVDD, and the source terminal is connected to an anode terminal of the organic EL element OLED. For the transistor T3, the gate terminal is connected to a monitoring control line G2_Moni(i), the drain terminal is connected to the anode terminal of the organic EL element OLED, and the source terminal is connected to the data line DL(j). For the capacitor Cst, one end is connected to the gate terminal of the transistor T2 and the other end is connected to the drain terminal of the transistor T2. A cathode terminal of the organic EL element OLED is connected to a low-level power supply line ELVSS.

In the present embodiment, the transistors T1 to T3 in the pixel circuit 50 are all of an N-channel type. In addition, in the present embodiment, TFTs containing InGaZnO are adopted as the transistors T1 to T3. The same also applies to the transistors in the write control line drive circuit 300 and the monitoring control line drive circuit 400. Note that when a configuration using only single-channel transistors is adopted, the present invention can also be applied to a configuration using transistors other than TFTs containing InGaZnO.

As shown in FIG. 6, the data line drive and current measurement circuit 200 includes a DA converter 21, an operational amplifier 22, a capacitor 23, and a switch 24. A digital video signal DV is provided to an input terminal of the DA converter 21. The DA converter 21 converts the digital video signal DV into an analog data voltage. An output terminal of the DA converter 21 is connected to a non-inverting input terminal of the operational amplifier 22. Therefore, the data voltage is inputted to the non-inverting input terminal of the operational amplifier 22. An inverting input terminal of the operational amplifier 22 is connected to the data line DL(j). The switch 24 is provided between the inverting input terminal and output terminal of the operational amplifier 22. The capacitor 23 is provided between the inverting input terminal and output terminal of the operational amplifier 22 and in parallel with the switch 24. The input/output control signal DWT included in the source control signal SCTL is provided to a control terminal of the switch 24. The output terminal of the operational amplifier 22 is connected to an input terminal of an AD converter 131 included in the grayscale correcting unit 130 in the display control circuit 100.

In a configuration such as that described above, when the input/output control signal DWT is at a high level, the switch 24 goes into an on state and a short-circuit state occurs between the inverting input terminal and output terminal of the operational amplifier 22. At this time, the operational amplifier 22 functions as a buffer amplifier. By this, the data voltage provided to the non-inverting input terminal of the operational amplifier 22 is applied to the data line DL(j). When the input/output control signal DWT is at a low level, the switch 24 goes into an off state and the inverting input terminal and output terminal of the operational amplifier 22 are connected to each other through the capacitor 23. At this time, the operational amplifier 22 and the capacitor 23 function as an integrating circuit. By this, an output voltage (monitored voltage Vmo) from the operational amplifier 22 becomes a voltage generated according to a drive current that is outputted to the data line DL(j) from the pixel circuit 50. The AD converter 131 converts the output voltage (monitored voltage Vmo) from the operational amplifier 22 into a digital value. In the present embodiment, during the current measurement period the input/output control signal DWT goes to a low level, and during periods other than the current measurement period the input/output control signal DWT goes to a high level.

<3. Display Control Circuit>

Next, a detailed configuration and operation of the display control circuit 100 in the present embodiment will be described.

<3.1 Drive Control Unit>

Figure 7:
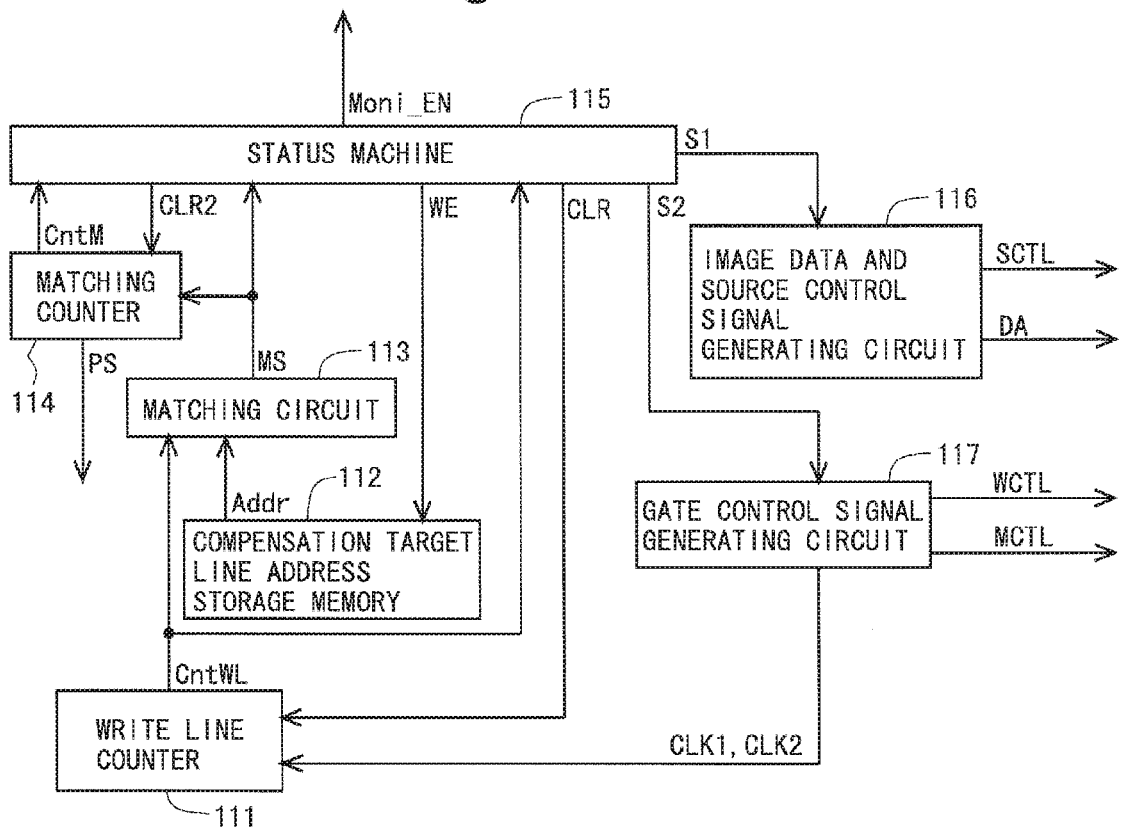
FIG. 7 is a block diagram showing a detailed configuration of a drive control unit in a display control circuit in the embodiment.

FIG. 7 is a block diagram showing a detailed configuration of the drive control unit 110 in the display control circuit 100. As shown in FIG. 7, the drive control unit 110 includes a write line counter 111, a compensation target line address storage memory 112, a matching circuit 113, a matching counter 114, a status machine 115, an image data and source control signal generating circuit 116, and a gate control signal generating circuit 117. Note that in the present embodiment a clock counter is implemented by the write line counter 111, a measurement target address value storage unit is implemented by the compensation target line address storage memory 112, a matching determination circuit is implemented by the matching circuit 113, and a grayscale identification counter is implemented by the matching counter 114.

Figure 8:
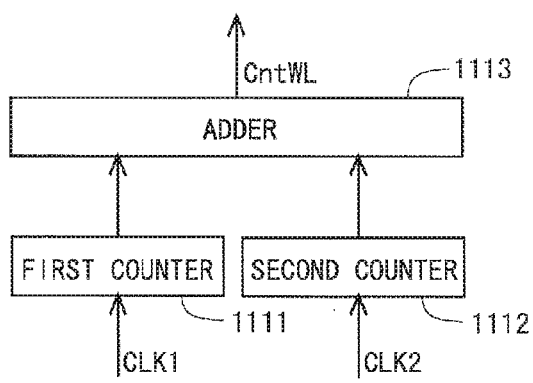
FIG. 8 is a block diagram showing a configuration of a write line counter in the embodiment.

FIG. 8 is a block diagram showing a configuration of the write line counter 111. As shown in FIG. 8, the write line counter 111 is composed of a first counter 1111 that counts the number of clock pulses of a clock signal CLK1 outputted from the gate control signal generating circuit 117; a second counter 1112 that counts the number of clock pulses of a clock signal CLK2 outputted from the gate control signal generating circuit 117; and an adder 1113 that outputs a value indicating the sum of an output value of the first counter 1111 and an output value of the second counter 1112, as a count value CntWL.

Figure 9:
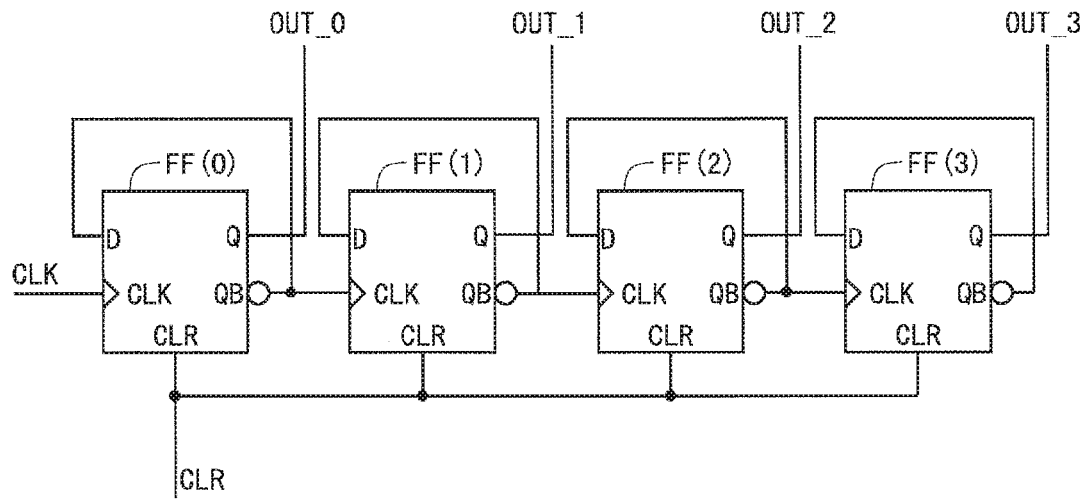
FIG. 9 is a block diagram for describing a configuration of counters (a first counter and a second counter) in the embodiment.

FIG. 9 is a block diagram for describing a configuration of counters (the first counter 1111 and the second counter 1112) used in the present embodiment. Here, for convenience sake, a 4-bit counter is described as an example. This counter is composed of four D-type flip-flops FF(0) to FF(3) which are connected in series with each other. OUT_0 representing the least significant bit of 4 bits is outputted from the D-type flip-flop FF(0), and OUT_3 representing the most significant bit of the 4 bits is outputted from the D-type flip-flop FF(3). Note that in practice, for example, a 10-bit counter is used. That is, the number of connections of flip-flops may be increased as the number of write control lines G1_WL increases.

Figure 10:
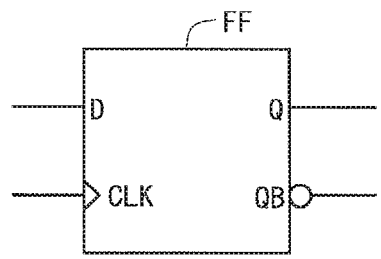
FIG. 10 is a diagram for describing a D-type flip-flop in the embodiment.
Figure 11:
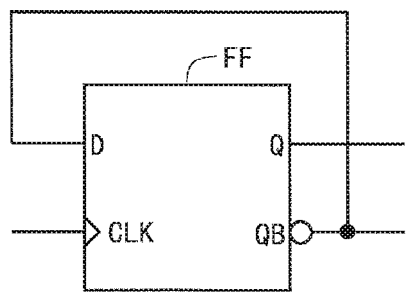
FIG. 11 is a diagram for describing a D-type flip-flop in the embodiment.

FIG. 10 is a diagram showing one D-type flip-flop FF. The D-type flip-flop FF outputs, as Q, a value indicating a logic value of an input signal D obtained at a rise time point of a clock signal CLK, and outputs, as QB, a value obtained by inverting the Q. Since the D-type flip-flop FF operates in this manner, when, as shown in FIG. 11, the D-type flip-flop is configured to provide QB as an input signal D, the value of Q is inverted every time the clock signal CLK rises (every time the logic value of the clock signal CLK changes from 0 to 1), except for the first rise time point of the clock signal CLK.

Figure 12:
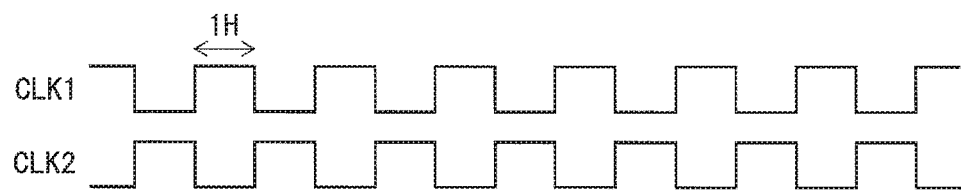
FIG. 12 is a signal waveform diagram of a clock signal CLK1 and a clock signal CLK2 during a normal operating period in the embodiment.
Figure 13:
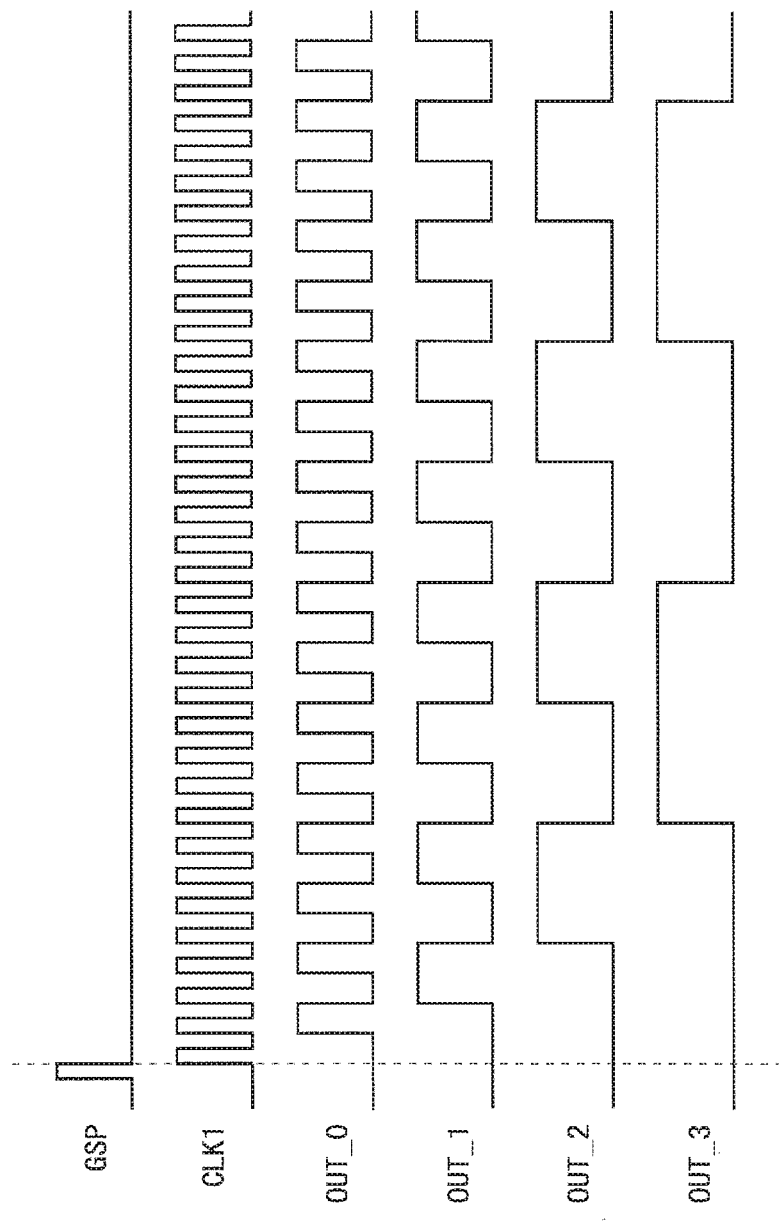
FIG. 13 is a diagram for describing changes in outputs from the first counter in the embodiment.

For the first counter 1111, the clock signal CLK1 is provided to the flip-flop FF(0). Here, taking the above-described fact into account, in the configuration shown in FIG. 9, every time the logic value of the clock signal CLK1 changes from 0 to 1, the flip-flop FF(0) inverts the value of OUT_0. In addition, every time the logic value of OUT_0 changes from 1 to 0, the flip-flop FF(1) inverts the value of OUT_1. Furthermore, every time the logic value of OUT_1 changes from 1 to 0, the flip-flop FF(2) inverts the value of OUT_2. Moreover, every time the logic value of OUT_2 changes from 1 to 0, the flip-flop FF(3) inverts the value of OUT_3. Note that during the normal operating period, the clock signal CLK1 and the clock signal CLK2 change as shown in FIG. 12. By the above, in the first counter 1111, after the occurrence of a pulse of a start pulse signal GSP, OUT_1 to OUT_4 change as shown in FIG. 13, based on the clock signal CLK1. In addition, as can be grasped from FIG. 12, the clock signal CLK1 and the clock signal CLK2 are shifted in phase by 180 degrees relative to each other. Therefore, in the second counter 1112, after the occurrence of a pulse of the start pulse signal GSP, the values of OUT_1 to OUT_4 change as shown in FIG. 14, based on the clock signal CLK2.

Figure 14:
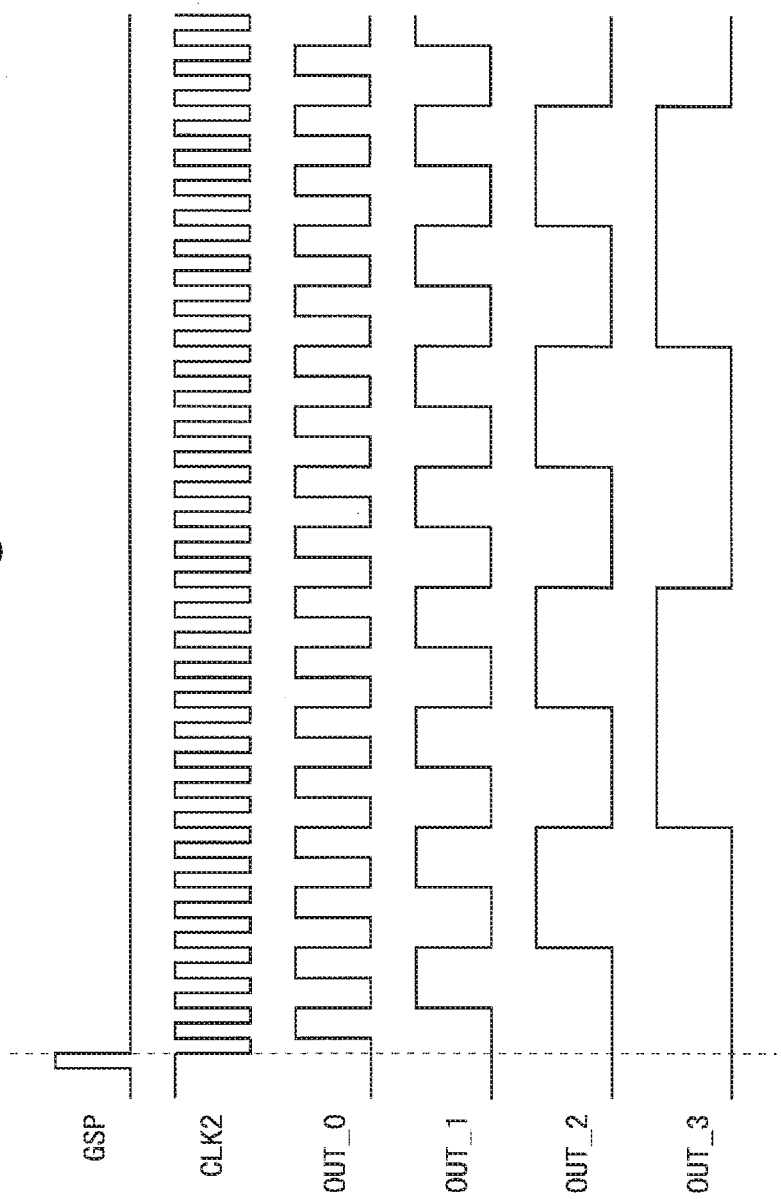
FIG. 14 is a diagram for describing changes in outputs from the second counter in the embodiment.

As can be grasped from FIGS. 13 and 14, at a time point where the clock signal CLK1 rises for the first time after the occurrence of a pulse of the start pulse signal GSP, the count value CntWL outputted from the write line counter 111 is 0. Thereafter, every time one of the clock signal CLK1 and the clock signal CLK2 rises, the count value CntWL is incremented by 1. Note that the D-type flip-flops FF(0) to FF(3) are initialized based on a clear signal CLR. In other words, the count value CntWL outputted from the write line counter 111 is set to 0 based on the clear signal CLR.

For FIG. 7, the compensation target line address storage memory 112 stores an address (hereinafter, referred to as "compensation target line address") Addr indicating a row (compensation target row) on which drive current measurement is to be performed next. The compensation target line address Addr stored in the compensation target line address storage memory 112 is rewritten by a rewrite signal WE which is outputted from the status machine 115. Note that in this specification a description is made assuming that a numerical value indicating which row the compensation target row is set in the compensation target line address Addr. For example, when the fifth row is the compensation target row, the compensation target line address is 5.

The matching circuit 113 determines whether the count value CntWL outputted from the write line counter 111 matches the compensation target line address Addr stored in the compensation target line address storage memory 112, and outputs a matching signal MS indicating a result of the determination. Note that the count value CntWL and the compensation target line address Addr are represented by the same number of bits. In the present embodiment, when the count value CntWL matches the compensation target line address Addr, the matching signal MS is set to a high level, and when they do not match each other, the matching signal MS is set to a low level. The matching signal MS outputted from the matching circuit 113 is provided to the status machine 115 and the matching counter 114.

Figure 15:
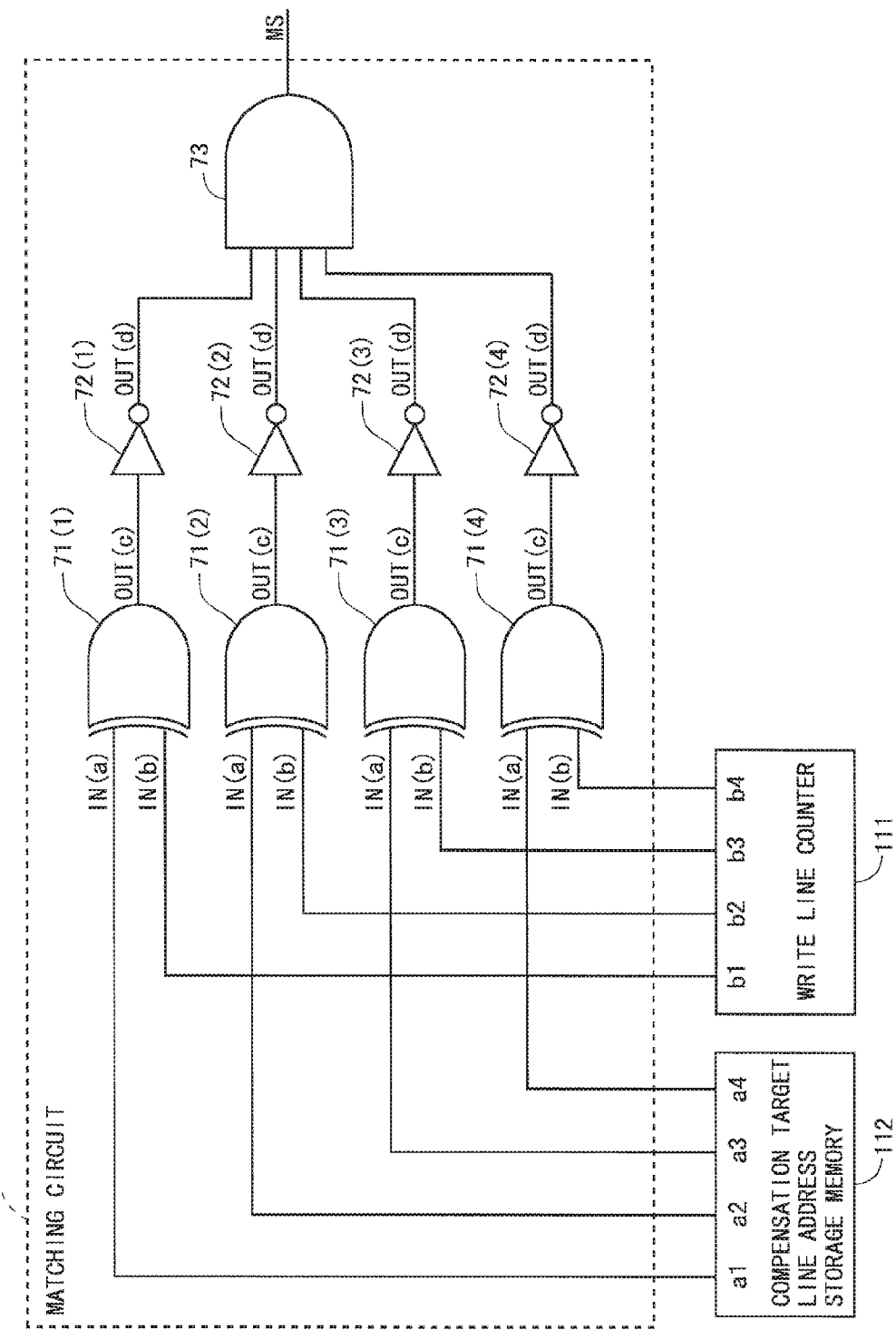
FIG. 15 is a logic circuit diagram showing a configuration of a matching circuit in the embodiment.

FIG. 15 is a logic circuit diagram showing a configuration of the matching circuit 113 in the present embodiment. The matching circuit 113 is composed of four EXOR circuits (exclusive-OR circuits) 71(1) to 71(4), four inverters (NOT circuits) 72(1) to 72(4), and one AND circuit 73. The EXOR circuits 71(1) to 71(4) have a one-to-one correspondence with the inverters 72(1) to 72(4). To one input terminal of each EXOR circuit 71 is provided, as first input data IN(a), 1-bit data of 4-bit data representing a compensation target line address Addr which is stored in the compensation target line address storage memory 112. To the other input terminal of each EXOR circuit 71 is provided, as second input data IN(b), 1-bit data of 4-bit data (count value CntWL) which is outputted from the write line counter 111. Each EXOR circuit 71 outputs, as first output data OUT(c), a value indicating the exclusive-OR of the logic value of the first input data IN(a) and the logic value of the second input data IN(b). To an input terminal of each inverter 72 is provided the first output data OUT(c) outputted from a corresponding EXOR circuit 71. Each inverter 72 outputs, as second output data OUT(d), a value obtained by inverting the logic value of the first output data OUT(c) (i.e., a value indicating the logical NOT of the logic value of the first output data OUT(c)). The AND circuit 73 outputs, as a matching signal MS, a value indicating the AND of four pieces of second output data OUT (d) outputted from the inverters 72(1) to 72(4). Note that although here an example of 4-bit data comparison is shown, in practice, for example, 10 EXOR circuits 71 and 10 inverters 72 are provided for 10-bit data comparison. That is, the numbers of the EXOR circuits 71 and the inverters 72 may be increased as the number of the write control lines G1_WL increases.

Note that when the number of pieces of data inputted to the AND circuit 73 is large, for example, as shown in FIG. 16, a configuration may be adopted that includes a plurality of AND circuits 731, each outputting a value indicating the AND of second output data OUT(d) outputted from a plurality of inverters 72; and one AND circuit 732 that outputs a value indicating the AND of the values outputted from the plurality of AND circuits 731, instead of one AND circuit 73.

FIG. 17 is a diagram showing a truth table for when focusing on a configuration for one bit in the matching circuit 113 shown in FIG. 15. When "the value of the first input data IN(a) is 0 and the value of the second input data IN(b) is 0", the value of the first output data OUT(c) is 0 and the value of the second output data OUT(d) is 1. When "the value of the first input data IN(a) is 1 and the value of the second input data IN(b) is 0", the value of the first output data OUT(c) is 1 and the value of the second output data OUT(d) is 0. When "the value of the first input data IN(a) is 0 and the value of the second input data IN(b) is 1", the value of the first output data OUT(c) is 1 and the value of the second output data OUT(d) is 0. When "the value of the first input data IN(a) is 1 and the value of the second input data IN(b) is 1", the value of the first output data OUT(c) is 0 and the value of the second output data OUT(d) is 1.

For example, when 4-bit data (compensation target line address Addr) stored in the compensation target line address storage memory 112 is "a1=0, a2=1, a3=0, and a4=0" and 4-bit data (count value CntWL) outputted from the write line counter 111 is "b1=0, b2=1, b3=0, and b4=0", the values of first output data OUT(c) outputted from the EXOR circuits 71(1) to 71(4) are all 0, and the values of second output data OUT(d) outputted from the inverters 72(1) to 72(4) are all 1. As a result, the matching signal MS is set to a high level. In addition, for example, when 4-bit data (compensation target line address Addr) stored in the compensation target line address storage memory 112 is "a1=0, a2=1, a3=0, and a4=1" and 4-bit data (count value CntWL) outputted from the write line counter 111 is "b1=0, b2=1, b3=0, and b4=0", the values of first output data OUT(c) outputted from the EXOR circuits 71(1) to 71(3) are 0, but the value of first output data OUT(c) outputted from the EXOR circuit 71(4) is 1. By this, the values of second output data OUT(d) outputted from the inverters 72(1) to 72(3) are 1 and the value of second output data OUT(d) outputted from the inverter 72(4) is 0. As a result, the matching signal MS is set to a low level. In the above-described manner, when the compensation target line address Addr matches the count value CntWL, the matching signal MS outputted from the matching circuit 113 is set to a high level, and when the compensation target line address Addr does not match the count value CntWL, the matching signal MS outputted from the matching circuit 113 is set to a low level.

Meanwhile, in the present embodiment, after the occurrence of a pulse of the start pulse signal GSP, the write control lines G1_WL sequentially go into a selected state based on the clock signals CLK1 and CLK2 In addition, the count value CntWL outputted from the write line counter 111 is incremented by 1 based on the clock signals CLK1 and CLK2. Accordingly, the count value CntWL indicates the value of a row of a write control line G1_WL to be brought into a selected state. For example, assuming that the clock signal CLK1 rises at a given time point tx and accordingly the count value CntWL becomes 50, a write control line G1_WL(50) of the 50th row goes into a selected state for one horizontal scanning period from the time point tx. In addition, since the compensation target line address Addr indicating a compensation target row is stored in the compensation target line address storage memory 112, a time point where the count value CntWL matches the compensation target line address Addr is a start time point of a characteristic detection processing period.

For FIG. 7, the matching counter 114 outputs a count value CntM. After the count value CntM is initialized (after set to 0), every time the matching signal MS changes from a low level to a high level, 1 is added to the count value CntM. In addition, from the matching counter 114 is outputted a grayscale position instruction signal PS for identifying whether drive current measurement has been performed based on the first grayscale P1 or drive current measurement has been performed based on the second grayscale P2. Note that the matching counter 114 is initialized based on a clear signal CLR2 outputted from the status machine.

The status machine 115 outputs a control signal S1, a control signal S2, and a monitoring enable signal Moni_EN, based on the matching signal MS. In addition, the status machine 115 outputs a clear signal CLR for initializing the write line counter 111 and a clear signal CLR2 for initializing the matching counter 114. Furthermore, the status machine 115 outputs a rewrite signal WE for updating the compensation target line address Addr stored in the compensation target line address storage memory 112.

The image data and source control signal generating circuit 116 outputs a source control signal SCTL and data signals DA, based on the control signal S1 provided from the status machine 115. Note that the control signal S1 includes, for example, a signal instructing to start a compensation process (a series of processes for compensating for variations in the characteristics of a drive transistor). The gate control signal generating circuit 117 outputs a write control signal WCTL and a monitoring control signal MCTL, based on the control signal S2 provided from the status machine 115. Note that the control signal S2 includes, for example, a signal that controls the clock operation of the clock signals CLK1 to CLK4 and a signal that instructs to output pulses of the start pulse signals GSP and MSP.

<3.2 Grayscale Correcting Unit>

The grayscale correcting unit 130 reads correction data DH (an offset value and a gain value) held in the correction data calculation and storage unit 120, and corrects the data signal DA outputted from the drive control unit 110. Then, the grayscale correcting unit 130 outputs data obtained by the correction (data corresponding to a data voltage to be written into a corresponding pixel circuit 50), as a digital video signal DV. The digital video signal DV outputted from the grayscale correcting unit 130 is transmitted to the data line drive and current measurement circuit 200.

<3.3 Correction Data Calculation and Storage Unit>

FIG. 18 is a block diagram showing a detailed configuration of the correction data calculation and storage unit 120 in the display control circuit 100. As shown in FIG. 18, the correction data calculation and storage unit 120 includes an AD converter 121, a correction arithmetic circuit 122, a nonvolatile memory 123, and a buffer memory 124. The AD converter 121 converts a monitored voltage Vmo (analog voltage) outputted from the data line drive and current measurement circuit 200 into a digital signal Dmo. The correction arithmetic circuit 122 obtains correction data (an offset value and a gain value) to be used for correction by the grayscale correcting unit 130, based on the digital signal Dmo. At that time, in order to determine whether the digital signal Dmo outputted from the AD converter 121 is data based on the first grayscale P1 or data based on the second grayscale P2, a grayscale position signal PS outputted from the matching counter 114 is referred to. The correction data DH obtained by the correction arithmetic circuit 122 is held in the nonvolatile memory 123. Specifically, the nonvolatile memory 123 holds, for each pixel circuit 50, an offset value and a gain value. When correction of a data signal DA is performed by the grayscale correcting unit 130, corresponding correction data DH that is temporarily read into the buffer memory 124 from the nonvolatile memory 123 is used.

<4. Configuration of the Write Control Line Drive Circuit>

Figure 19:
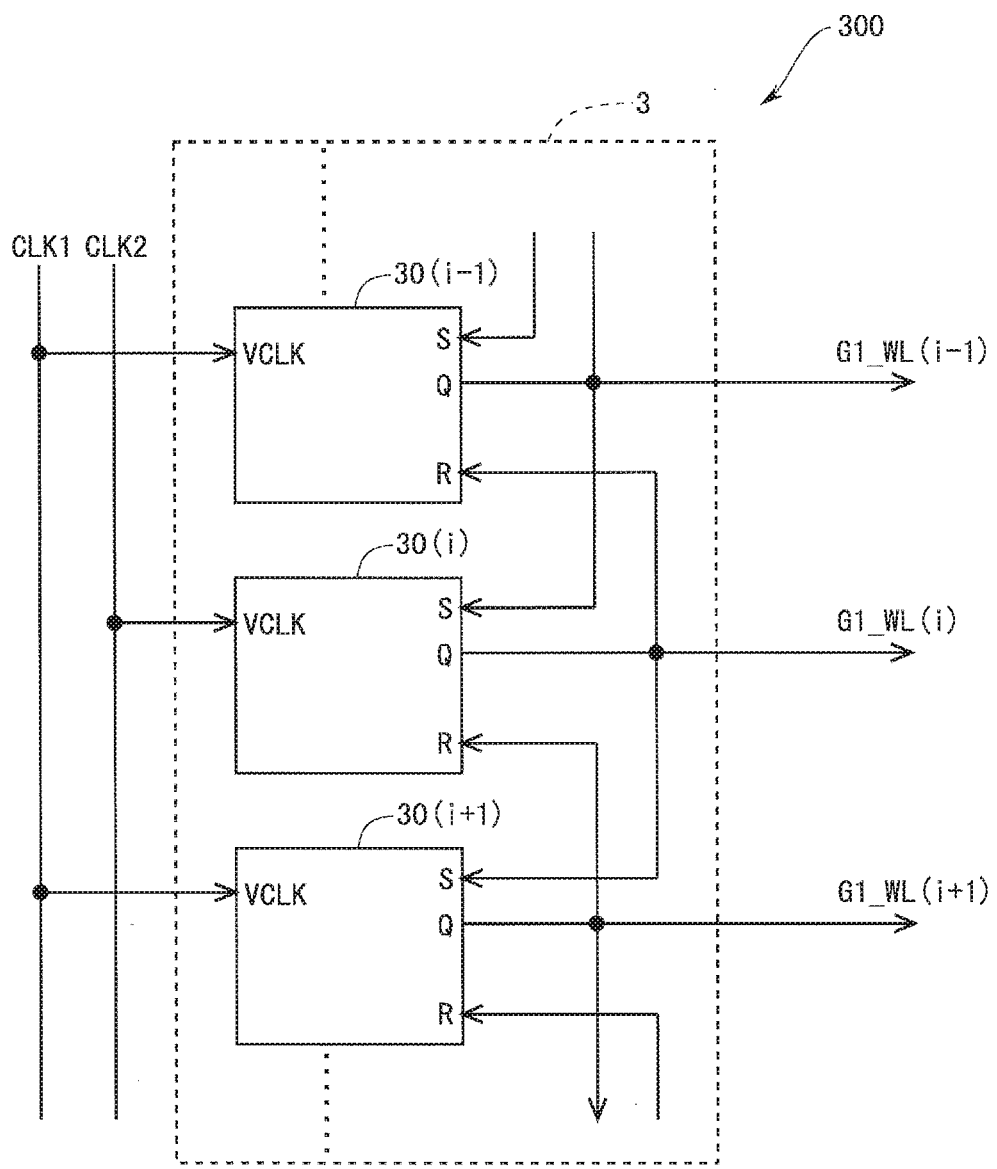
FIG. 19 is a block diagram showing a configuration of a write control line drive circuit in the embodiment.

FIG. 19 is a block diagram showing a configuration of the write control line drive circuit 300 in the present embodiment. The write control line drive circuit 300 is implemented using a shift register 3. The stages of the shift register 3 are provided so as to have a one-to-one correspondence with the write control lines G1_WL in the display unit 500. Specifically, in the present embodiment, the write control line drive circuit 300 includes the shift register 3 having 1080 stages. Note that FIG. 19 only shows unit circuits 30 (i−1) to 30 (i+1) forming an (i−1)th stage to an (i+1)th stage out of the 1080 stages. For convenience of description, it is assumed that i is an even number. Each stage (each unit circuit) of the shift register 3 is provided with an input terminal for receiving a clock signal VCLK; an input terminal for receiving a set signal S; an input terminal for receiving a reset signal R; and an output terminal for outputting a state signal Q indicating an internal state of the stage. Reference character Q shown in FIGS. 9 to 11 has no relation to reference character Q shown in FIG. 19. Note that in the present embodiment a first shift register is implemented by the shift register 3, and a first unit circuit is implemented by the unit circuit 30.

For FIG. 19, signals provided to the input terminals of each stage (each unit circuit) of the shift register 3 are as follows. For the odd-numbered stages a clock signal CLK1 is provided as the clock signal VCLK, and for the even-numbered stages a clock signal CLK2 is provided as the clock signal VCLK. In addition, for any stage, a state signal Q outputted from the preceding stage is provided as the set signal S, and a state signal Q outputted from the subsequent stage is provided as the reset signal R. Note, however, that for the first stage (not shown in FIG. 19) a start pulse signal GSP is provided as the set signal S. Note that a low-level power supply voltage VSS (not shown in FIG. 19) is provided to all of the unit circuits 30 in a shared manner. The state signal Q is outputted from each stage of the shift register 3. The stage signal Q outputted from each stage is outputted to a corresponding write control line G1_WL, and is provided to the preceding stage as the reset signal R and provided to the subsequent stage as the set signal S.

Figure 20:
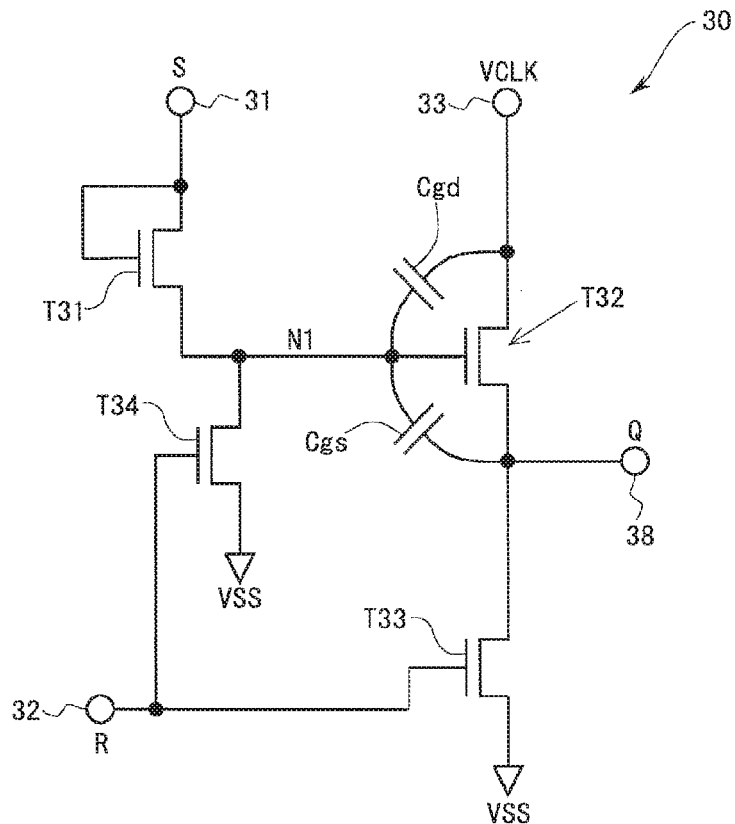
FIG. 20 is a circuit diagram showing a configuration of a unit circuit in a shift register composing the write control line drive circuit (a configuration of a portion of the shift register for one stage) in the embodiment.

FIG. 20 is a circuit diagram showing a configuration of a unit circuit 30 in the shift register 3 composing the write control line drive circuit 300 (a configuration of a portion of the shift register 3 for one stage). As shown in FIG. 20, the unit circuit 30 includes four transistors T31 to T34. In addition, the unit circuit 30 has three input terminals 31 to 33 and one output terminal 38, in addition to input terminals for the low-level power supply voltage VSS. Here, the input terminal that receives the set signal S is denoted by reference character 31, the input terminal that receives the reset signal R is denoted by reference character 32, and the input terminal that receives the clock signal VCLK is denoted by reference character 33. In addition, the output terminal that outputs the state signal Q is denoted by reference character 38. A parasitic capacitance Cgd is formed between the gate terminal and drain terminal of the transistor T32, and a parasitic capacitance Cgs is formed between the gate terminal and source terminal of the transistor T32. A source terminal of the transistor T31, the gate terminal of the transistor T32, and a drain terminal of the transistor T34 are connected to one another. Note that a region (wiring) where they are connected to one another is hereinafter referred to as "first node". The first node is denoted by reference character N1.

For the transistor T31, a gate terminal and a drain terminal are connected to the input terminal 31 (i.e., diode-connected), and the source terminal is connected to the first node N1. For the transistor T32, the gate terminal is connected to the first node N1, the drain terminal is connected to the input terminal 33, and the source terminal is connected to the output terminal 38. For the transistor T33, a gate terminal is connected to the input terminal 32, a drain terminal is connected to the output terminal 38, and a source terminal is connected to the input terminal for the low-level power supply voltage VSS. For the transistor T34, a gate terminal is connected to the input terminal 32, the drain terminal is connected to the first node N1, and a source terminal is connected to the input terminal for the low-level power supply voltage VSS.

Next, functions of the components in the unit circuit 30 will be described. The transistor T31 changes the potential of the first node N1 toward a high level when the set signal S goes to a high level. The transistor T32 provides the potential of the clock signal VCLK to the output terminal 38 when the potential of the first node N1 goes to a high level. The transistor T33 changes the potential of the output terminal 38 toward the potential of the low-level power supply voltage VSS when the reset signal R goes to a high level. The transistor T34 changes the potential of the first node N1 toward the potential of the low-level power supply voltage VSS when the reset signal R goes to a high level.

Note that for the unit circuit 30, in the present embodiment, a first output terminal is implemented by the output terminal 38, a first transistor is implemented by the transistor T31, a second transistor is implemented by the transistor T32, a third transistor is implemented by the transistor T33, a fourth transistor is implemented by the transistor T34, and a control clock signal is implemented by the clock signal VCLK.

Figure 21:
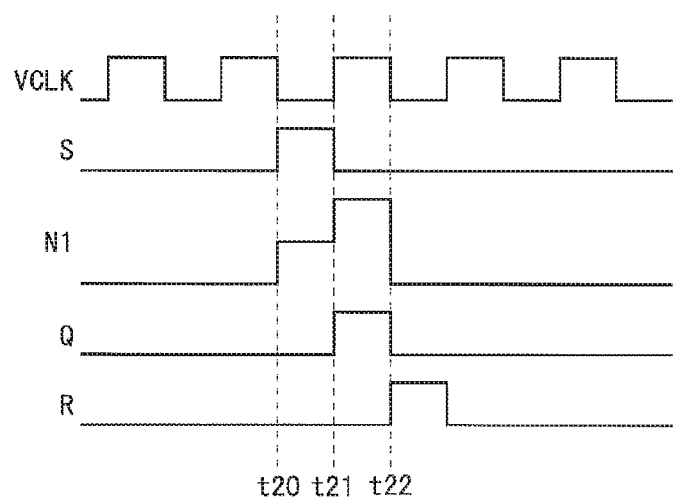
FIG. 21 is a timing chart for describing basic operation of the unit circuit in the embodiment.

With reference to FIGS. 20 and 21, basic operation of the unit circuit 30 will be described. The waveforms of the clock signals CLK1 and CLK2 which are provided as the clock signals VCLK to the unit circuits 30 are as shown in FIG. 12 (excluding the characteristic detection processing period). As shown in FIG. 21, during a period before time point t20, the potential of the first node N1 and the potential of the state signal Q (the potential of the output terminal 38) are at a low level. In addition, the clock signal VCLK which goes to a high level every predetermined period is provided to the input terminal 33. Note that for FIG. 21, although the actual waveforms have some delay, here ideal waveforms are shown.

When time point t20 is reached, a pulse of the set signal S is provided to the input terminal 31. Since the transistor T31 is diode-connected as shown in FIG. 20, the transistor T31 goes into an on state by the pulse of the set signal S. By this, the potential of the first node N1 increases.

When time point t21 is reached, the clock signal VCLK changes from a low level to a high level. At this time, since the reset signal R is at a low level, the transistor T34 is in an off state. Therefore, the first node N1 is in a floating state. As described above, the parasitic capacitance Cgd is formed between the gate terminal and drain terminal of the transistor T32, and the parasitic capacitance Cgs is formed between the gate terminal and source terminal of the transistor T32. Hence, due to the bootstrap effect, the potential of the first node N1 greatly increases. As a result, a large voltage is applied to the transistor T32. By this, the potential of the state signal Q (the potential of the output terminal 38) increases to the high-level potential of the clock signal VCLK. Note that during a period from time point t21 to time point t22, the reset signal R is at a low level. Hence, since the transistor T33 is maintained in an off state, the potential of the state signal Q does not decrease during this period.

When time point t22 is reached, the clock signal VCLK changes from the high level to the low level. By this, with a decrease in the potential of the input terminal 33, the potential of the state signal Q decreases, and furthermore, the potential of the first node N1 also decreases through the parasitic capacitances Cgd and Cgs. In addition, at time point t22, a pulse of the reset signal R is provided to the input terminal 32. By this, the transistor T33 and the transistor T34 go into an on state. By the transistor T33 going into an on state, the potential of the state signal Q decreases to a low level, and by the transistor T34 going into an on state, the potential of the first node N1 decreases to a low level.

Considering the operation of the unit circuit 30 such as that described above and the configuration of the shift register 3 shown in FIG. 19, it is grasped that operation such as that shown below is performed during the normal operating period. When a pulse of the start pulse signal GSP serving as the set signal S is provided to the first stage of the shift register 3, shift pulses included in the state signals Q outputted from the respective stages are sequentially transferred from the 0th stage to subsequent stages, based on the clock signals CLK1 and CLK2. In addition, the state signals Q outputted from the respective stages are outputted to corresponding write control lines G1_WL. Therefore, the write control lines G1_WL sequentially go into a selected state one by one, according to the transfer of the shift pulses. In this manner, during the normal operating period, the write control lines G1_WL sequentially go into a selected state one by one.

Note that the configuration of the unit circuit 30 is not limited to the configuration shown in FIG. 20 (the configuration including four transistors T31 to T34). In general, to achieve an improvement in drive performance and an improvement in reliability, the unit circuit 30 includes transistors whose number is larger than four. The present invention can also be applied to such a case.

<5. Configuration of the Monitoring Control Line Drive Circuit>

Figure 22:
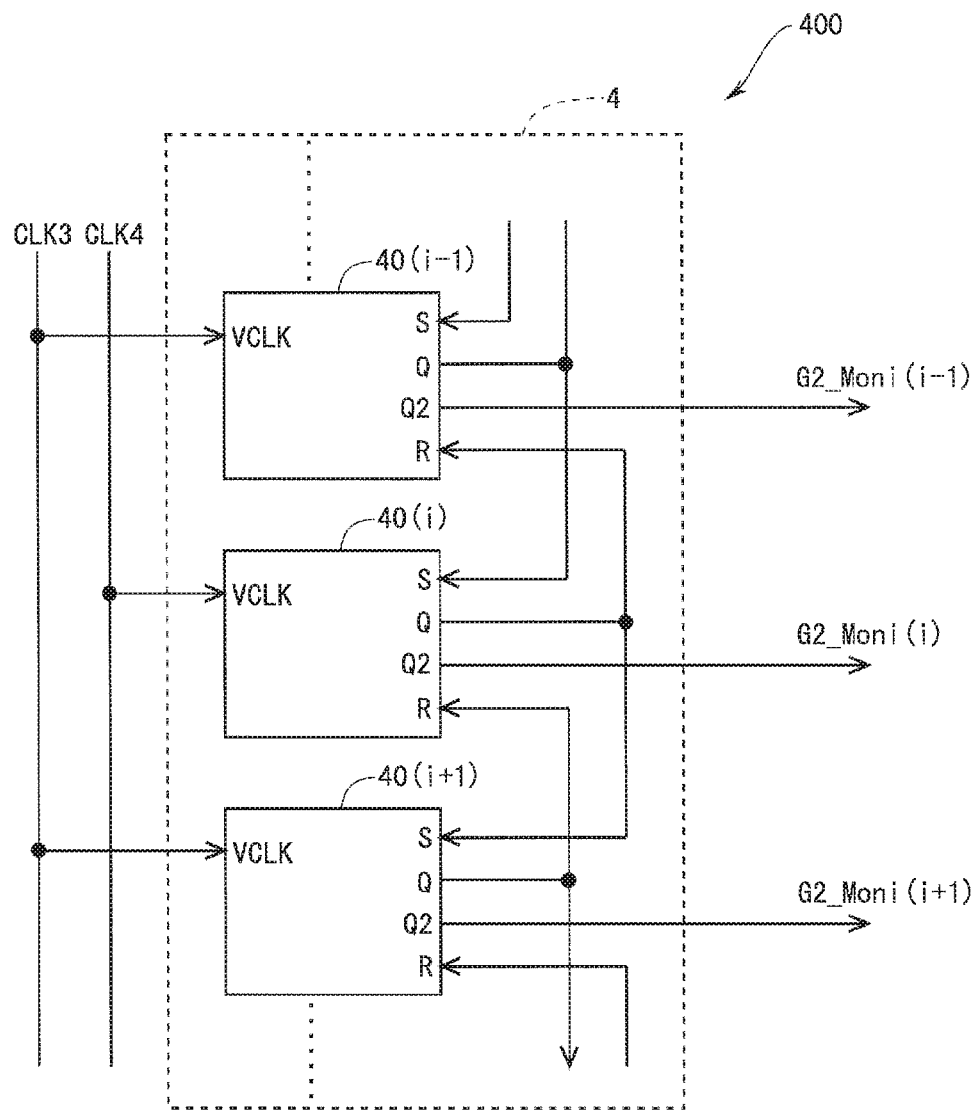
FIG. 22 is a block diagram showing a configuration of a monitoring control line drive circuit in the embodiment.

FIG. 22 is a block diagram showing a configuration of the monitoring control line drive circuit 400 in the present embodiment. The monitoring control line drive circuit 400 is implemented using a shift register 4. The stages of the shift register 4 are provided so as to have a one-to-one correspondence with the monitoring control lines G2_Moni in the display unit 500. Specifically, in the present embodiment, the monitoring control line drive circuit 400 includes the shift register 4 having 1080 stages. Note that FIG. 22 only shows unit circuits 40($i$−1) to 40($i$+1) forming an ($i$−1)th stage to an ($i$+1)th stage out of the 1080 stages. Each stage (each unit circuit) of the shift register 4 is provided with an input terminal for receiving a clock signal VCLK; an input terminal for receiving a set signal S; an input terminal for receiving a reset signal R; an output terminal for outputting a state signal Q; and an output terminal for outputting an output signal Q2. Note that in the present embodiment a second shift register is implemented by the shift register 4, and a second unit circuit is implemented by the unit circuit 40.

Figure 23:
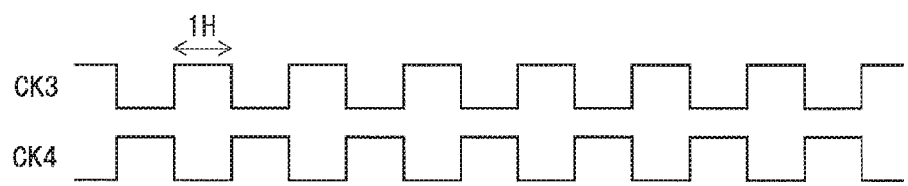
FIG. 23 is a signal waveform diagram of a clock signal CLK3 and a clock signal CLK4 during a normal operating period in the embodiment.

For FIG. 22, signals provided to the input terminals of each stage (each unit circuit) of the shift register 4 are as follows. For the odd-numbered stages a clock signal CLK3 is provided as the clock signal VCLK, and for the even-numbered stages a clock signal CLK4 is provided as the clock signal VCLK. In addition, for any stage, a state signal Q outputted from the preceding stage is provided as the set signal S, and a state signal Q outputted from the subsequent stage is provided as the reset signal R. Note, however, that for the first stage (not shown in FIG. 22) a start pulse signal MSP is provided as the set signal S. Note that a low-level power supply voltage VSS (not shown in FIG. 22) is provided to all of the unit circuits 40 in a shared manner. Note also that a monitoring enable signal Moni_EN (not shown in FIG. 22) is provided to all of the unit circuits 40 in a shared manner. The state signal Q and the output signal Q2 are outputted from each stage of the shift register 4. The stage signal Q outputted from each stage is provided to the preceding stage as the reset signal R and provided to the subsequent stage as the set signal S. The output signal Q2 outputted from each stage is outputted to a corresponding monitoring control line G2_Moni. Note that during the normal operating period, the clock signal CLK3 and the clock signal CLK4 change as shown in FIG. 23.

Figure 24:
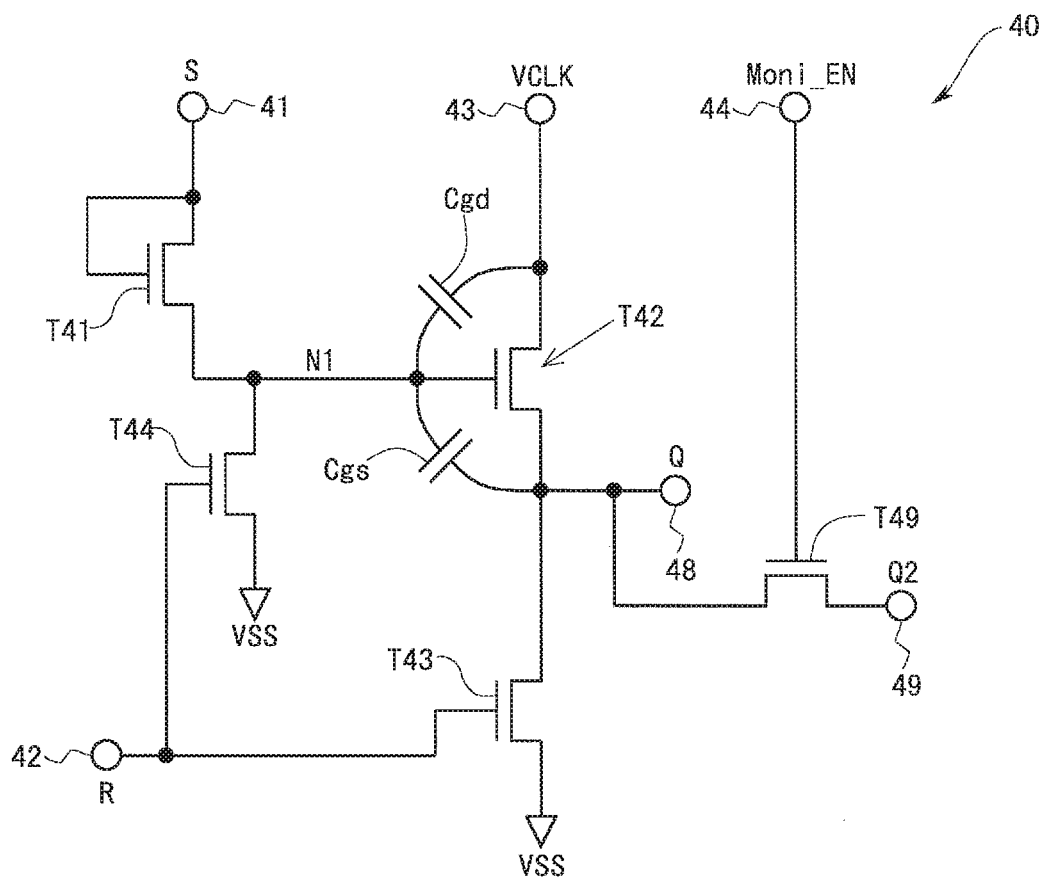
FIG. 24 is a circuit diagram showing a configuration of a unit circuit in a shift register composing the monitoring control line drive circuit (a configuration of a portion of the shift register for one stage) in the embodiment.

FIG. 24 is a circuit diagram showing a configuration of a unit circuit 40 in the shift register 4 composing the monitoring control line drive circuit 400 (a configuration of a portion of the shift register 4 for one stage). As shown in FIG. 24, the unit circuit 40 includes five transistors T41 to T44 and T49. In addition, the unit circuit 40 has four input terminals 41 to 44 and two output terminals 48 and 49, in addition to input terminals for the low-level power supply voltage VSS. The transistors T41 to T44, the input terminals 41 to 43, and the output terminal 48 in FIG. 24 correspond to the transistors T31 to T34, the input terminals 31 to 33, and the output terminal 38 in FIG. 20, respectively. That is, the unit circuit 40 has the same configuration as the unit circuit 30 with the exception of the following. The unit circuit 40 is provided with the output terminal 49 that is different than the output terminal 48. In addition, the unit circuit 40 is provided with the transistor T49 having a drain terminal connected to the output terminal 48, a source terminal connected to the output terminal 49, and a gate terminal to which the monitoring enable signal Moni_EN is provided. Note that as with the unit circuit 30 in the shift register 3 composing the write control line drive circuit 300, the unit circuit 40 is also not limited to the configuration shown in FIG. 24.

Note that for the unit circuit 40, in the present embodiment, a first output terminal is implemented by the output terminal 48, a second output terminal is implemented by the output terminal 49, a first transistor is implemented by the transistor T41, a second transistor is implemented by the transistor T42, a third transistor is implemented by the transistor T43, a fourth transistor is implemented by the transistor T44, an output control transistor is implemented by the transistor T49, and a control clock signal is implemented by the clock signal VCLK.

As described above, the unit circuit 40 has the same configuration as the unit circuit 30 with the exception of being provided with the output terminal 49 and the transistor T49. In addition, the clock signals CLK3 and CLK4 having waveforms shown in FIG. 23 are provided to the shift register 4. By the above, the state signals Q outputted from the respective stages of the shift register 4 sequentially go to a high level, based on the clock signals CLK3 and CLK4. Here, when focusing on any unit circuit 40, if the monitoring enable signal Moni_EN is at a low level, the transistor T49 is in an off state. At this time, even when the state signal Q is at a high level, the output signal Q2 is maintained at a low level. Hence, a monitoring control line G2_Moni corresponding to this unit circuit 40 does not go into a selected state. On the other hand, if the monitoring enable signal Moni_EN is at a high level, the transistor T49 is in an on state. At this time, when the state signal Q is at a high level, the output signal Q2 also goes to a high level. By this, the monitoring control line G2_Moni corresponding to this unit circuit 40 goes into a selected state.

Figure 25:
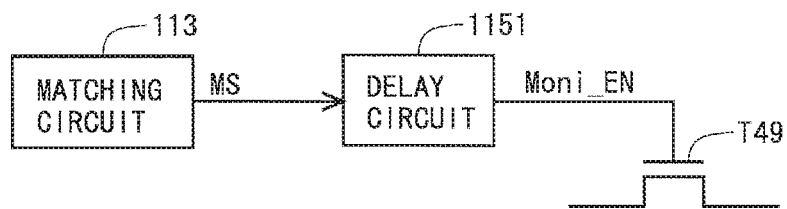
FIG. 25 is a diagram for describing how to provide a monitoring enable signal to a transistor T49 in the unit circuit in the embodiment.

Now, how to provide the monitoring enable signal Moni_EN to the transistor T49 in the unit circuit 40 will be described with reference to FIG. 25. As shown in FIG. 25, the monitoring enable signal Moni_EN provided to the transistor T49 is outputted from a delay circuit 1151. The delay circuit 1151 is provided in the status machine 115 in the drive control unit 110 in the display control circuit 100. When the count value CntWL outputted from the write line counter 111 matches the compensation target line address Addr stored in the compensation target line address storage memory 112, the matching signal MS changes from a low level to a high level. The delay circuit 1151 delays the waveform of the matching signal MS by one horizontal scanning period. A signal obtained by this is outputted as the monitoring enable signal Moni_EN from the delay circuit 1151. In the above-described manner, after one horizontal scanning period from a time point where the matching signal MS changes from a low level to a high level, the monitoring enable signal Moni_EN provided to the transistor T49 goes to a high level.

<6. Control Process Performed by the Display Control Circuit>

Next, a control process performed by the display control circuit 100 to allow the write control line drive circuit 300 and the monitoring control line drive circuit 400 to perform desired operation will be described. In each frame, a pulse of the start pulse signal GSP instructing to start the operation of the write control line drive circuit 300 is outputted in a state in which the monitoring enable signal Moni_EN is brought to a low level, the compensation target line address Addr indicating a compensation target row is set in the compensation target line address storage memory 112, and the write line counter 111 is initialized. In addition, after one horizontal scanning period from when the pulse of the start pulse signal GSP is outputted, a pulse of the start pulse signal MSP instructing to start the operation of the monitoring control line drive circuit 400 is outputted. After outputting the pulse of the start pulse signal GSP, the count value CntWL is incremented based on the clock signals CLK1 and CLK2.

As described above, the matching circuit 113 determines whether the count value CntWL outputted from the write line counter 111 matches the compensation target line address Addr stored in the compensation target line address storage memory 112. Then, when the count value CntWL matches the compensation target line address Addr, the matching signal MS provided to the status machine 115 changes from a low level to a high level. At this time, control such as that shown below is performed by the status machine 115. Note that the time point where the count value CntWL matches the compensation target line address Addr is a start time point of a characteristic detection processing period.

(a) Control Performed on the Clock Signals CLK1 and CLK2

After one horizontal scanning period from the time point where the count value CntWL matches the compensation target line address Addr, both of the clock signal CLK1 and the clock signal CLK2 are brought to a low level. Thereafter, clock operation performed by the clock signals CLK1 and CLK2 is brought into a stop state throughout a current measurement period. After the current measurement period ends, the states of the clock signals CLK1 and CLK2 are brought back to states obtained immediately before starting the current measurement period.

(b) Control Performed on the Clock Signals CLK3 and CLK4

After one horizontal scanning period from the time point where the count value CntWL matches the compensation target line address Addr, both of the clock signal CLK3 and the clock signal CLK4 are changed in the same manner as normal. Thereafter, clock operation performed by the clock signals CLK3 and CLK4 is brought into a stop state throughout the current measurement period. After the current measurement period ends, clock operation performed by the clock signals CLK3 and CLK4 is resumed.

(c) Control Performed on the Monitoring Enable Signal Moni_EN

After one horizontal scanning period from the time point where the count value CntWL matches the compensation target line address Addr, the monitoring enable signal Moni_EN is brought to a high level. Thereafter, the monitoring enable signal Moni_EN is maintained at the high level throughout the current measurement period. After the current measurement period ends, the monitoring enable signal Moni_EN is brought to a low level.

In other words, a control process such as that shown below is performed by the drive control unit 110 in the display control circuit 100. The drive control unit 110 controls the clock signals CLK1 and CLK2 such that only the potential of one of the two clock signals CLK1 and CLK2 that is provided to a unit circuit 30 corresponding to the compensation target row changes at the start time point and end time point of the current measurement period, and that clock operation performed by the clock signals CLK1 and CLK2 stops throughout the current measurement period. In addition, the drive control unit 110 controls the clock signals CLK3 and CLK4 such that clock operation performed by the clock signals CLK3 and CLK4 stops throughout the current measurement period after the potentials of the clock signals CLK3 and CLK4 change at the start time point of the current measurement period. Furthermore, the drive control unit 110 makes the monitoring enable signal Moni_EN active only during the current measurement period.

<7. Operation of the Write Control Line Drive Circuit>

Figure 26:
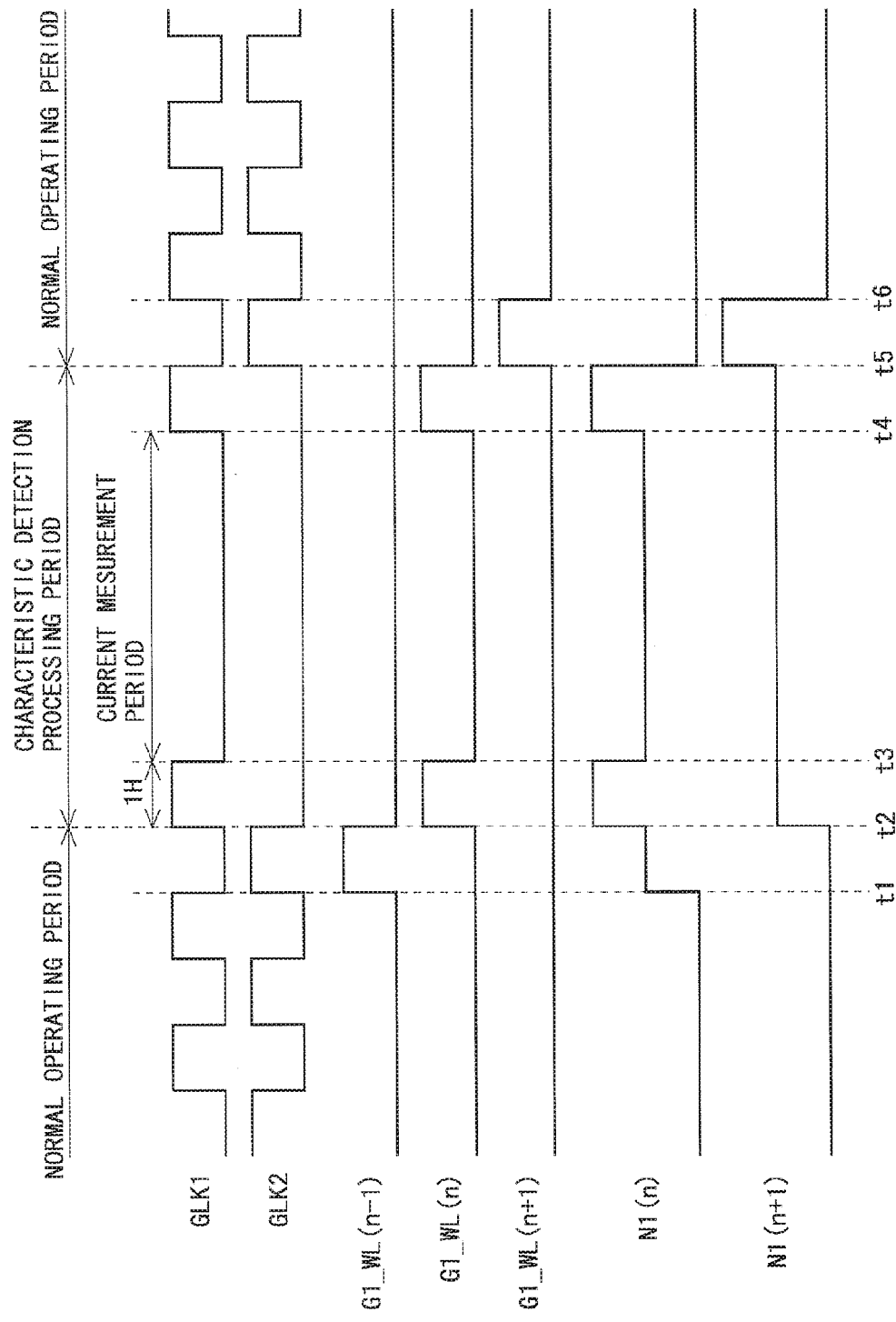
FIG. 26 is a timing chart for describing the operation of the write control line drive circuit in the embodiment.

While taking into account the content of the above-described control process performed by the display control circuit 100, the operation of the write control line drive circuit 300 performed during periods around the characteristic detection processing period will be described. FIG. 26 is a timing chart for describing the operation of the write control line drive circuit 300. Note that it is assumed that an nth row is set as the compensation target row.

When time point t1 is reached, a write control line G1_WL(n-1) of an (n-1)th row goes into a selected state. By this, in the (n-1)th row, a normal data write is performed. In addition, by the write control line G1_WL(n-1) of the (n-1)th row going into a selected state, the potential of a first node N1($n$) increases in a unit circuit 30($n$) of an nth stage in the shift register 3. Note that before a time point immediately before time point t2, the compensation target line address Addr does not match the count value CntWL.

When time point t2 is reached, the clock signal CLK1 rises. By this, in the unit circuit 30 ($n$) of the nth stage, the potential of the first node N1($n$) further increases. As a result, a write control line G1_WL(n) of the nth row goes into a selected state. At this time, pre-compensation data is written into each pixel circuit 50 of the nth row. In addition, at time point t2, by the write control line G1_WL(n) of the nth row going into a selected state, the potential of a first node N1($n$+1) increases in a unit circuit 30($n$+1) of an (n+1)th stage in the shift register 3.

Meanwhile, at time point t2, by the clock signal CLK1 rising, the compensation target line address Addr matches the count value CntWL. By this, the display control circuit 100 allows the clock signal CLK1 to fall at time point t3 which is one horizontal scanning period after time point t2, and then stops clock operation performed by the clock signals CLK1 and CLK2 until an end time point of the current measurement period (time point t4). That is, during a period from time point t3 to time point t4, the clock signal CLK1 and the clock signal CLK2 are maintained at a low level.

Note that at time point t3, due to the fall of the clock signal CLK1, the potential of the first node N1($n$) decreases in the unit circuit 30($n$) of the nth stage. In addition, at time point t3, since the clock signal CLK2 does not rise, a write control line G1_WL(n+1) of an (n+1)th row does not go into a selected state. Hence, a high-level reset signal R is not inputted to the unit circuit 30($n$) of the nth stage. Accordingly, the potential of the first node N1($n$) in the unit circuit 30($n$) of the nth stage obtained at a time point immediately after time point t3 is substantially equal to a potential obtained at a time point immediately before time point t2.

During the period from time point t3 to time point t4 (current measurement period), drive current measurement for detecting characteristics of drive transistors is performed. During the current measurement period, clock operation performed by the clock signals CLK1 and CLK2 stops. Therefore, during the current measurement period, the potential of the first node N1($n$) in the unit circuit 30($n$) of the nth stage is maintained.

When time point t4 which is the end time point of the current measurement period is reached, the display control circuit 100 resumes clock operation performed by the clock signals CLK1 and CLK2. At that time, one of the clock signal CLK1 and the clock signal CLK2 that falls at a start time point of the current measurement period (time point t3) (the clock signal CLK1 in an example shown in FIG. 26) is allowed to rise. Since the clock signal CLK1 rises at time point t4 in the above-described manner, the potential of the first node N1($n$) increases in the unit circuit 30($n$) of the nth stage. As a result, the write control line G1_WL(n) of the nth row goes into a selected state. At this time, post-compensation data is written into each pixel circuit 50 of the nth row.

When time point t5 is reached, the clock signal CLK1 falls and the clock signal CLK2 rises. During a period after this time point t5, the write control lines G1_WL go into a selected state row-by-row. By this, a normal data write is performed row-by-row.

<8. Operation of the Monitoring Control Line Drive Circuit>

Figure 27:
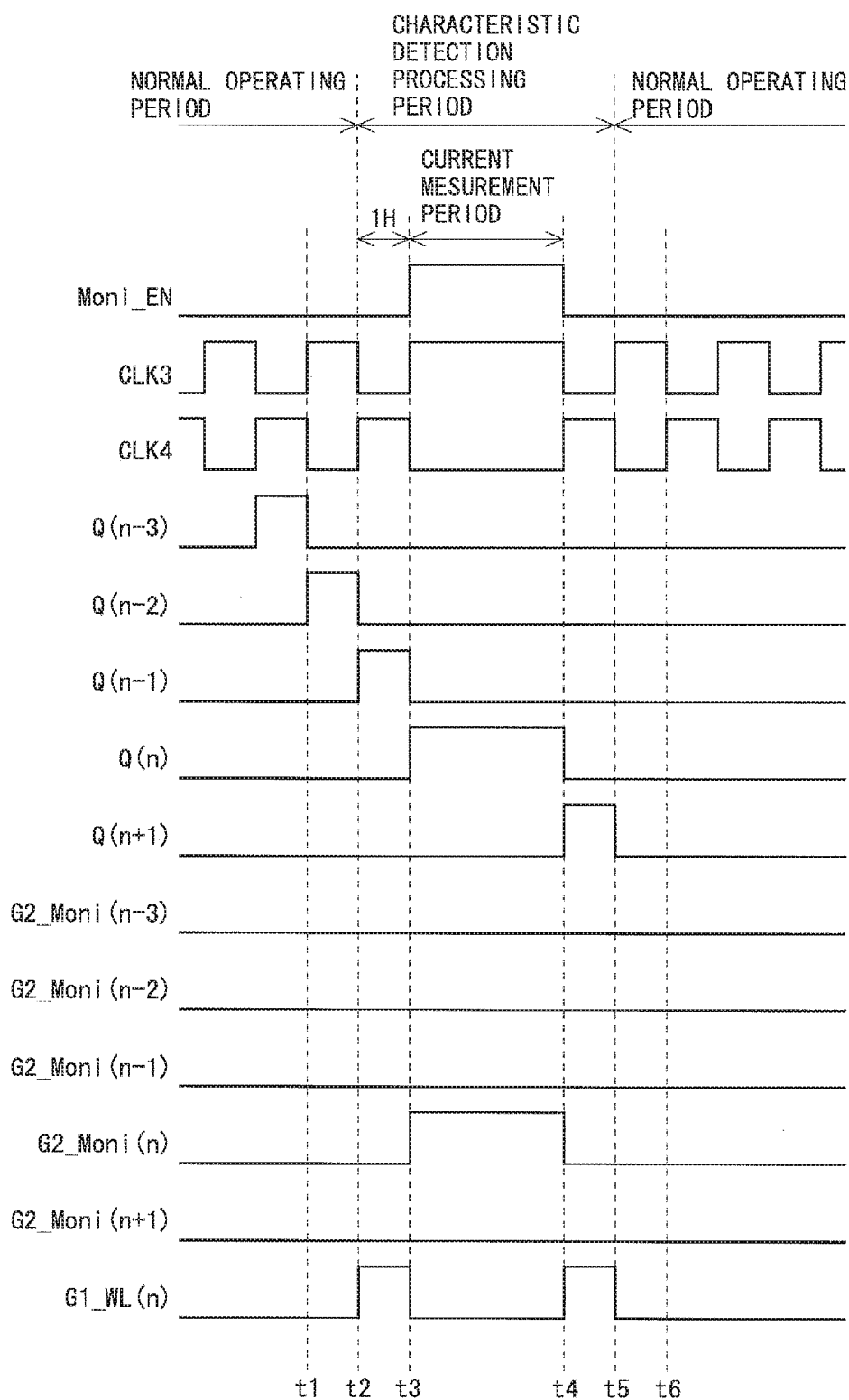
FIG. 27 is a timing chart for describing the operation of the monitoring control line drive circuit in the embodiment.

While taking into account the content of the above-described control process performed by the display control circuit 100, the operation of the monitoring control line drive circuit 400 performed during periods around the characteristic detection processing period will be described. FIG. 27 is a timing chart for describing the operation of the monitoring control line drive circuit 400. Note that here, too, it is assumed that an nth row is set as the compensation target row.

In the monitoring control line drive circuit 400, state signals Q outputted from the respective unit circuits 40 in the shift register 4 sequentially go to a high level for one horizontal scanning period, based on the clock signal CLK3 and the clock signal CLK4. For example, during a period from time point t1 to time point t2, a state signal Q(n-2) outputted from a unit circuit 40($n$-2) of an (n-2)th stage goes to a high level, and during a period from time point t2 to time point t3, a state signal Q(n-1) outputted from a unit circuit 40($n$-1) of an (n-1)th stage goes to a high level. However, since the monitoring enable signal Moni_EN is at a low level during a period before a time point immediately before time point t3, a monitoring control line G2_Moni(n-2) of an (n-2)th row and a monitoring control line G2_Moni(n-1) of an (n-1)th row do not go into a selected state.

When time point t2 is reached, the compensation target line address Addr matches the count value CntWL. By this, the display control circuit 100 changes the monitoring enable signal Moni_EN from the low level to the high level at time point t3 which is one horizontal scanning period after time point t2. As a result, at time point t3, the transistors T49 in all of the unit circuits 40 go into an on state. In addition, at time point t3, a state signal Q(n) outputted from a unit circuit 40(n) of an nth stage goes to a high level. By the above, an output signal Q2(n) outputted from the unit circuit 40(n) of the nth stage goes to a high level, and a monitoring control line G2_Moni(n) of the nth row goes into a selected state.

In addition, the display control circuit 100 changes the values of the clock signal CLK3 and the clock signal CLK4 at time point t3, and then stops clock operation performed by the clock signals CLK3 and CLK4 throughout the current measurement period (a period from time point t3 to time point t4). In an example shown in FIG. 27, since the clock signal CLK3 changes from a low level to a high level and the clock signal CLK4 changes from a high level to a low level at time point t3, the clock signal CLK3 is maintained at the high level and the clock signal CLK4 is maintained at the low level during the current measurement period. Since clock operation performed by the clock signals CLK3 and CLK4 stops in the above-described manner, the monitoring control line G2_Moni(n) of the nth row is maintained in the selected state throughout the current measurement period.

When time point t4 which is an end time point of the current measurement period is reached, the display control circuit 100 changes the monitoring enable signal Moni_EN from the high level to the low level, and resumes clock operation performed by the clock signals CLK3 and CLK4. During a period from time point t4 to time point t5, although a state signal Q(n+1) outputted from a unit circuit 40(n+1) of an (n+1)th stage goes to a high level, a monitoring control line G2_Moni(n+1) of an (n+1)th row does not go into a selected state since the monitoring enable signal Moni_EN is at the low level. Likewise, during a period after time point t5, any of the monitoring control lines G2_Moni does not go into a selected state.

<9. Operation of the Pixel Circuits>

Figure 28:
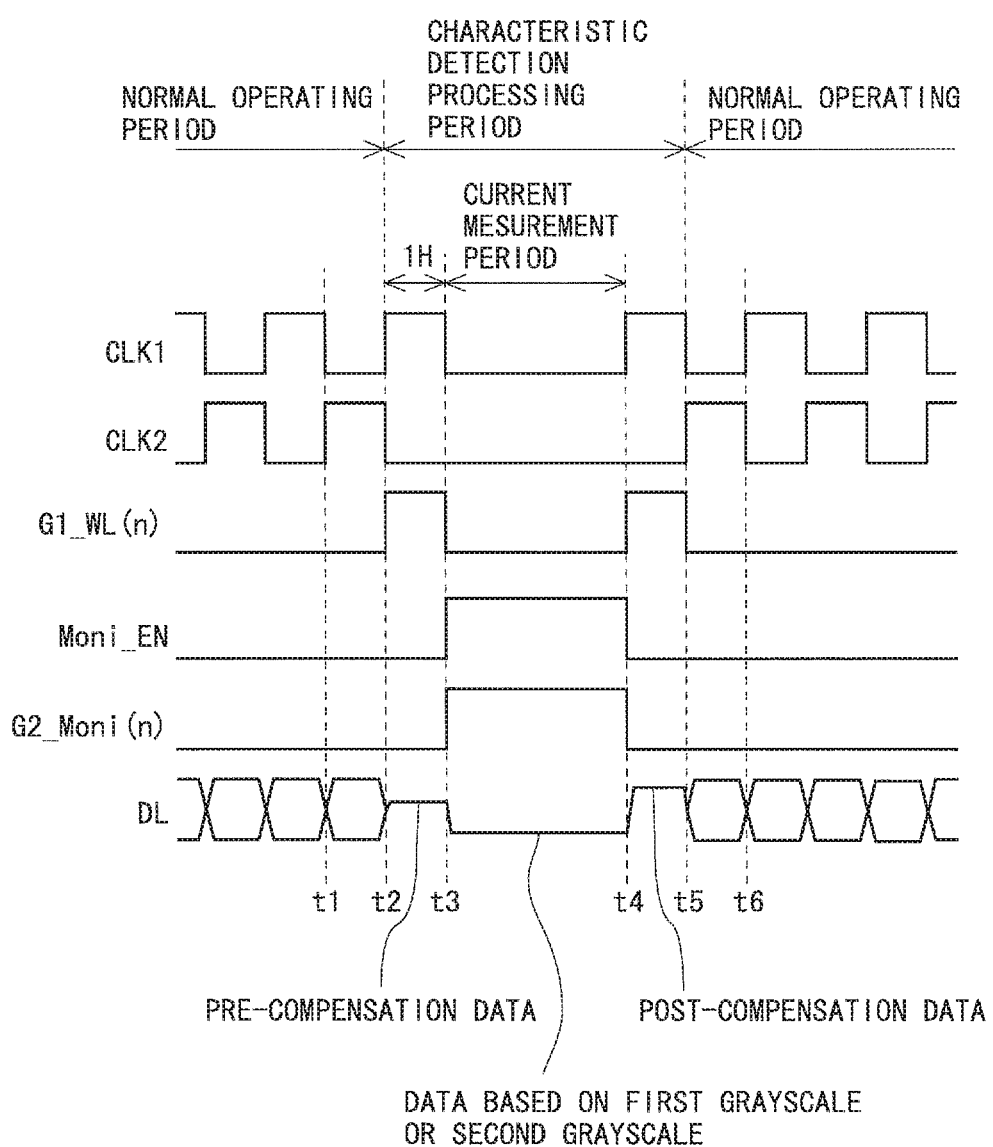
FIG. 28 is a timing chart for describing the operation of pixel circuits in the embodiment.

While taking into account the above-described operation of the write control line drive circuit 300 and the monitoring control line drive circuit 400, the operation, during the characteristic detection processing period, of pixel circuits 50 included in the compensation target row will be described. FIG. 28 is a timing chart for describing the operation of the pixel circuits 50. Note that here, too, it is assumed that an nth row is set as the compensation target row.

Figure 29:
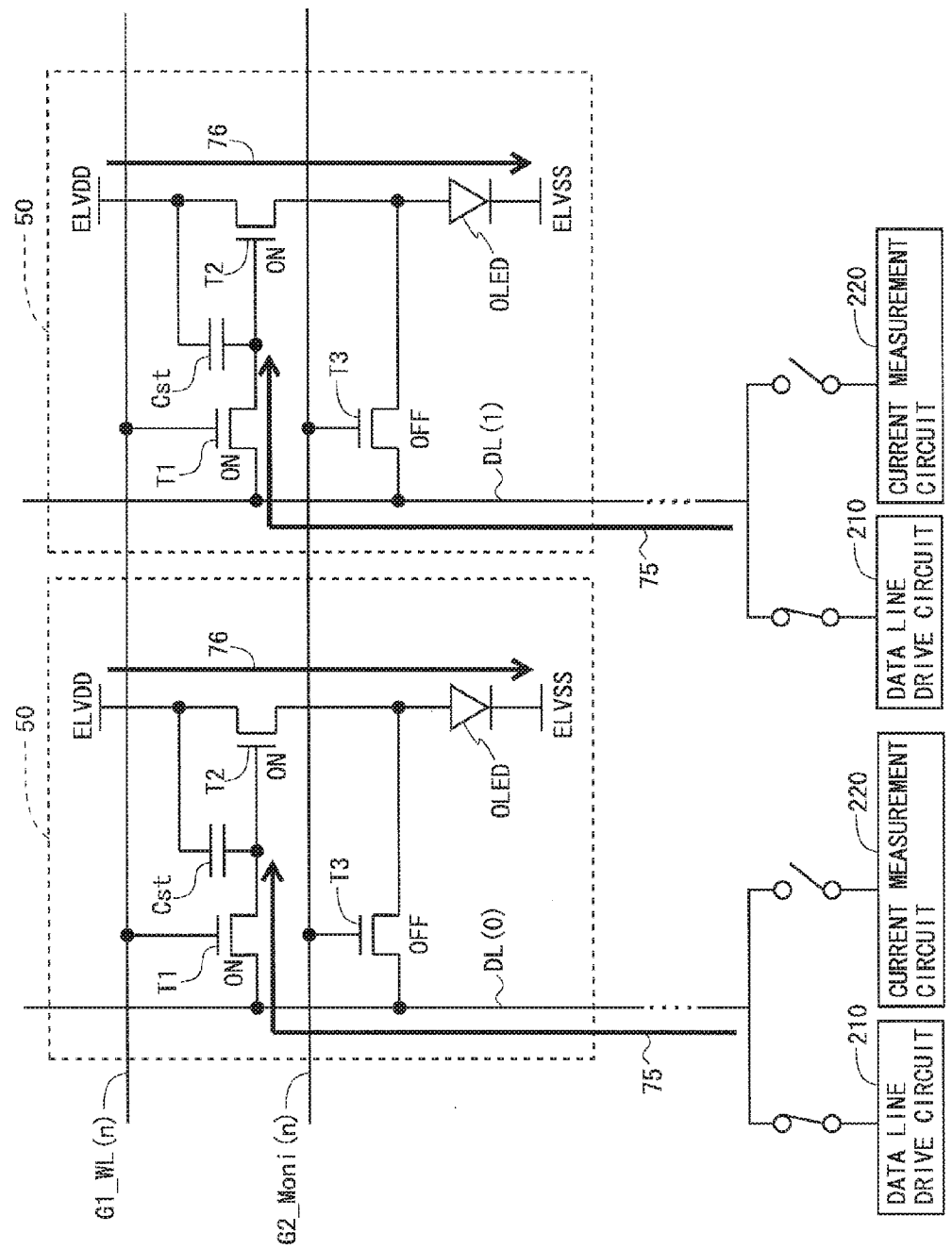
FIG. 29 is a diagram for describing the flows of currents in the pixel circuits in the embodiment.

When time point t2 is reached, a write control line G1_WL(n) goes into a selected state. By this, the transistors T1 go into an on state. At this time, pre-compensation data is supplied to the data lines DL from the data line drive circuits 210. Therefore, currents are supplied into the pixel circuits 50 from the data lines DL, as indicated by arrows denoted by reference character 75 in FIG. 29. By this, the capacitors Cst are charged based on the pre-compensation data, and the transistors T2 go into an on state. In addition, during a period before time point t3, since a monitoring control line G2_Moni(n) is in a non-selected state, the transistors T3 are maintained in an off state. By the above, during a period from time point t2 to time point t3 (pre-compensation data write period), drive currents are supplied to the organic EL elements OLED through the transistors T2, as indicated by arrows denoted by reference character 76 in FIG. 29. By this, the organic EL elements OLED emit light at luminances according to the drive currents. Note that, for example, for the odd-numbered frames, data based on the first grayscale P1 is used as pre-compensation data, and for the even-numbered frames, data based on the second grayscale P2 is used as pre-compensation data.

Figure 30:
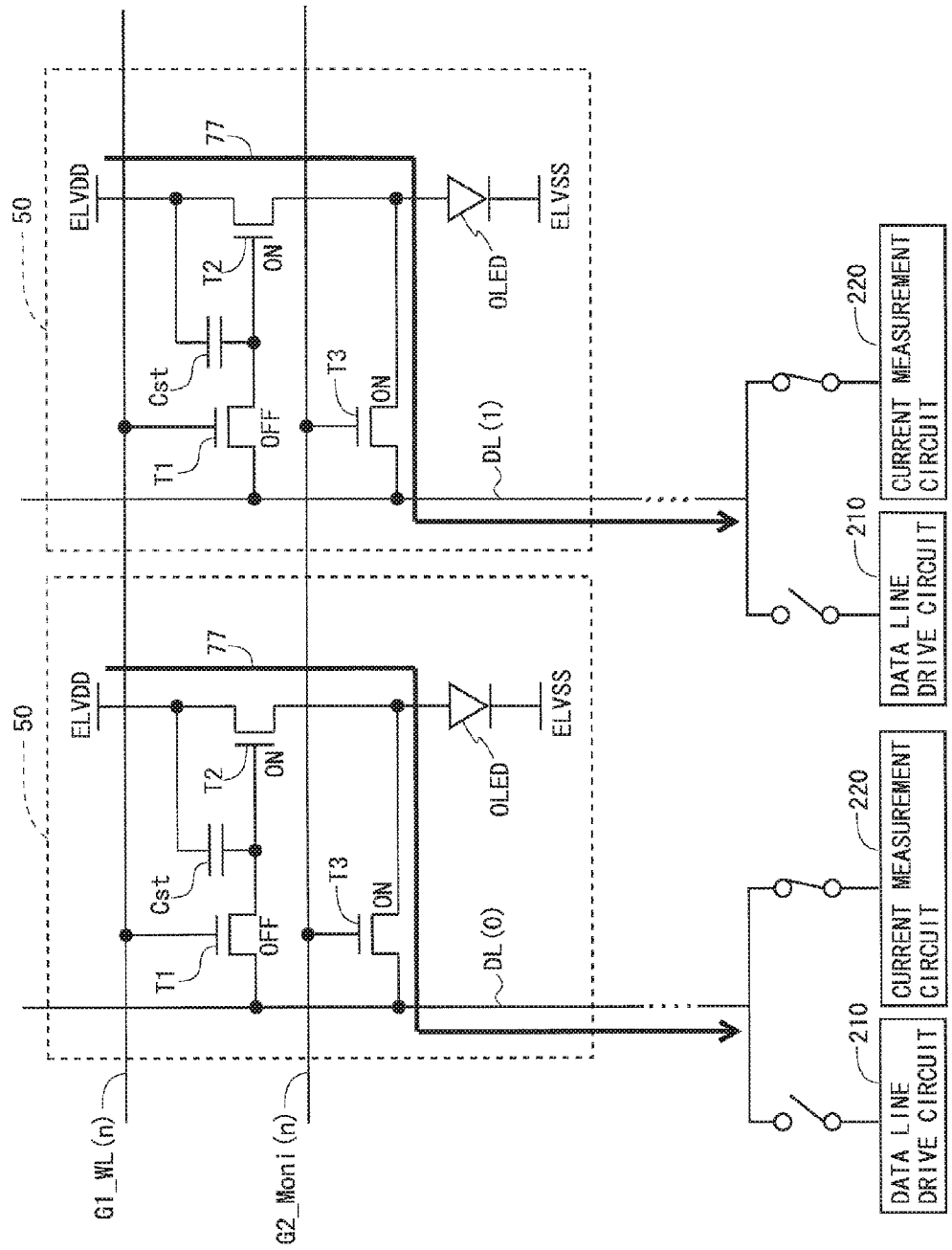
FIG. 30 is a diagram for describing the flows of currents in the pixel circuits in the embodiment.

When time point t3 is reached, the write control line G1_WL(n) goes into a non-selected state. By this, the transistors T1 go into an off state. In addition, at time point t3, the monitoring enable signal Moni_EN goes to a high level, and thus, the monitoring control line G2_Moni(n) goes into a selected state based on an output signal Q2(n) outputted from a unit circuit 40(n) of an nth stage in the shift register 4. By this, the transistors T3 go into an on state. As a result, drive currents are outputted to the data lines DL through the transistors T3, as indicated by arrows denoted by reference character 77 in FIG. 30. Then, the drive currents are measured by the corresponding current measurement circuits 220.

When time point t4 is reached, the write control line G1_WL(n) goes into a selected state again. By this, the transistors T1 go into an on state. In addition, at time point t4, the monitoring control line G2_Moni(n) goes into a non-selected state. By this, the transistors T3 go into an off state. At this time, post-compensation data is supplied to the data lines DL from the data line drive circuits 210. Therefore, currents are supplied into the pixel circuits 50 from the data lines DL, as indicated by the arrows denoted by reference character 75 in FIG. 29. By this, the capacitors Cst are charged based on the post-compensation data, and the transistors T2 go into an on state. By the above, during a period from time point t4 to time point t5 (post-compensation data write period), drive currents are supplied to the organic EL elements OLED through the transistors T2, as indicated by the arrows denoted by reference character 76 in FIG. 29. By this, the organic EL elements OLED emit light at luminances according to the drive currents.

<10. Specific Exemplary Operation>

Figure 1:
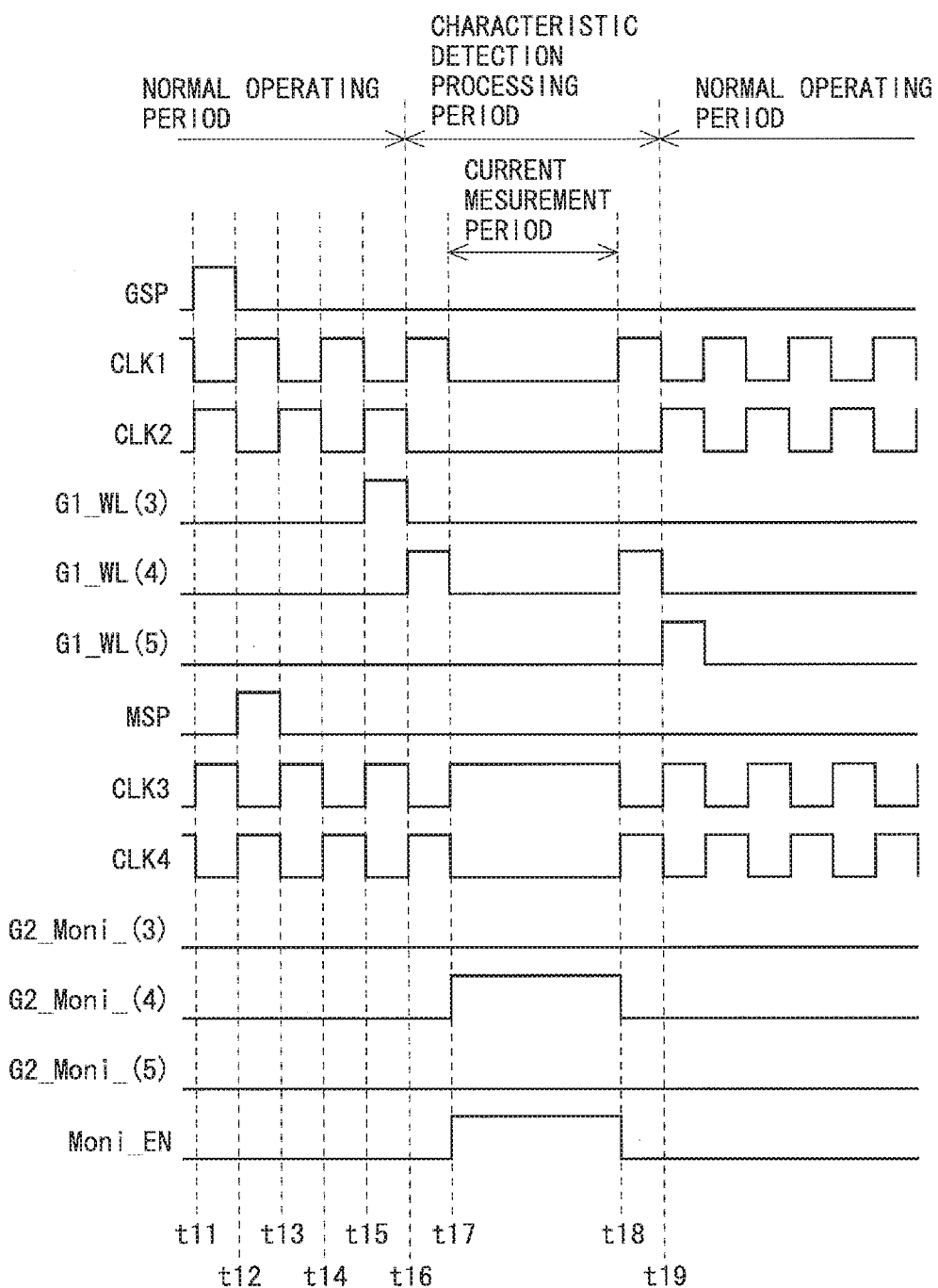
FIG. 1 is a timing chart for describing operation for when it is assumed that the fourth row is a compensation target row in an active matrix-type organic EL display device according to one embodiment of the present invention.

Next, with reference to FIG. 1, operation for a case in which the fourth row is set as the compensation target row will be described. Note that in FIG. 1 a period from time point t16 to time point t19 is the characteristic detection processing period, and a period from time point t17 to time point t18 is the current measurement period. Since the fourth row is the compensation target row, the compensation target line address Addr stored in the compensation target line address storage memory 112 is 4.

A pulse of the start pulse signal GSP occurs at time point t11, and a pulse of the start pulse signal MSP occurs at time point t12. When the clock signal CLK1 rises at time point t12, the count value CntWL is 0, and when the clock signal CLK2 rises at time point t13, the count value CntWL is 1. As such, the compensation target line address Addr does not match the count value CntWL before reaching time point t16. Therefore, during a period before time point t16, a normal data write is performed row-by-row.

When the clock signal CLK1 rises at time point t16, the count value CntWL becomes 4. That is, at time point t16, the compensation target line address Addr matches the count value CntWL. At this time, a write control line G1_WL(4) of the fourth row goes into a selected state and pre-compensation data is written into pixel circuits 50 of the fourth row.

At time point t17, the clock signal CLK1 changes from a high level to a low level. By this, the write control line G1_WL(4) of the fourth row goes into a non-selected state. In addition, the clock signal CLK3 changes from a low level to a high level and the clock signal CLK4 changes from a high level to a low level. Furthermore, the monitoring enable signal Moni_EN changes from a low level to a high level and a monitoring control line G2_Moni(4) of the fourth row goes into a selected state. By this, drive current measurement is performed during the period from time point t17 to time point t18.

When time point t18 which is an end time point of the current measurement period is reached, the clock signal CLK3 changes from the high level to the low level and the clock signal CLK4 changes from the low level to the high level. In addition, the monitoring enable signal Moni_EN changes from the high level to the low level and the monitoring control line G2_Moni(4) of the fourth row goes into a non-selected state. Furthermore, at time point t18, the clock signal CLK1 changes from the low level to the high level. By this, the write control line G1_WL(4) of the fourth row goes into a selected state again. At this time, post-compensation data is written into the pixel circuits 50 of the fourth row. During a period after time point t19, a normal data write is performed row-by-row.

<11. Characteristic Detection Process>

Figure 31:
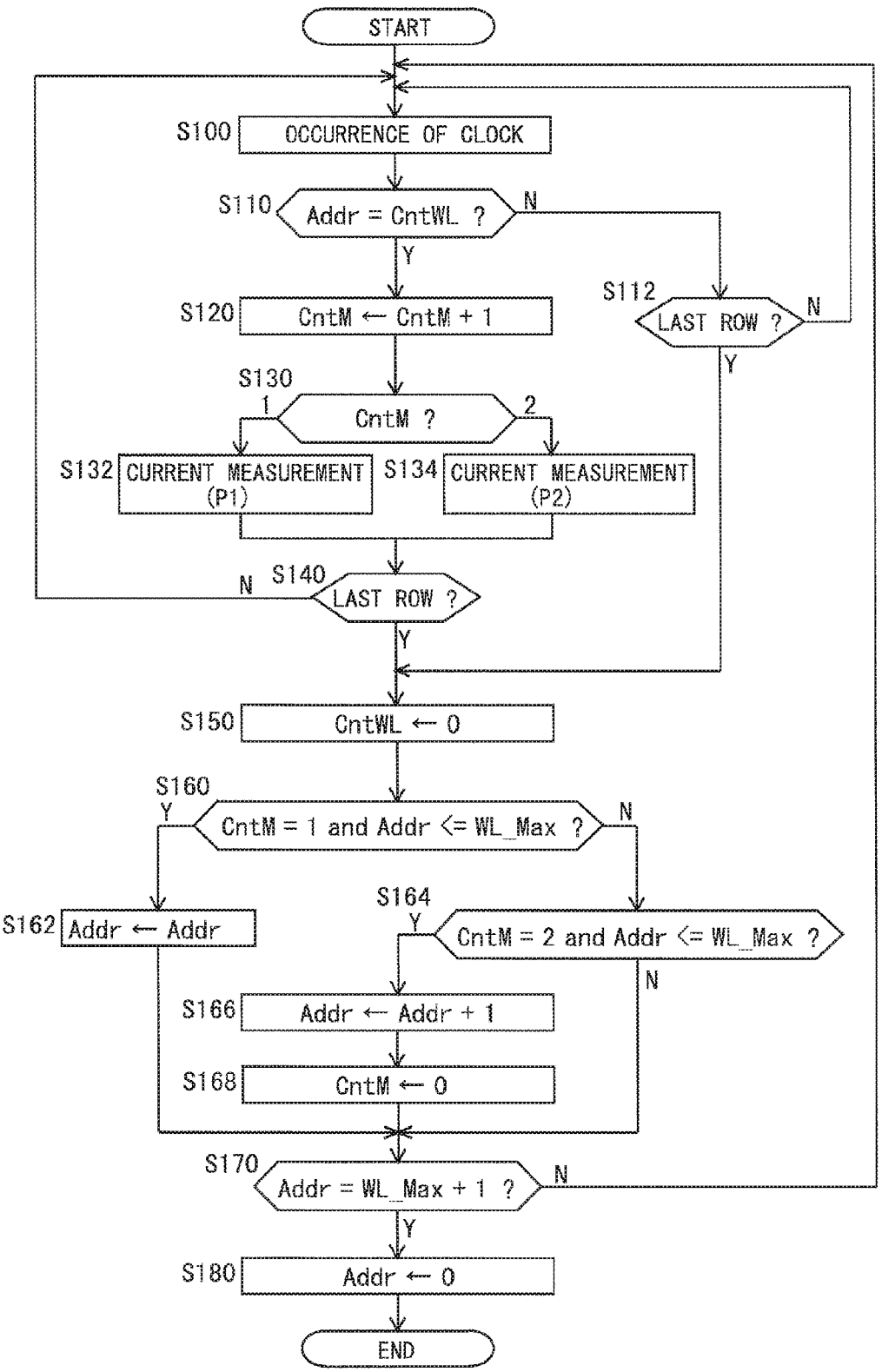
FIG. 31 is a flowchart showing a control procedure for a characteristic detection process (a series of processes for detecting characteristics of a drive transistor) in the embodiment.

FIG. 31 is a flowchart showing a control procedure for a characteristic detection process (a series of processes for detecting characteristics of a drive transistor). Note that it is assumed that the write line counter 111 and the matching counter 114 are initialized in advance and the value of the compensation target line address Addr stored in the compensation target line address storage memory 112 indicates a compensation target row.

After starting a characteristic detection process, every time a clock pulse of the clock signal CLK1 or the clock signal CLK2 occurs, one write control line G1_WL is selected as a scanning target (step S100). Then, a determination is made as to whether the compensation target line address Addr stored in the compensation target line address storage memory 112 matches a count value CntWL outputted from the write line counter 111 (step S110). If, as a result, they match each other, processing proceeds to step S120, and if they do not match each other, processing proceeds to step S112. At step S112, a determination is made as to whether the scanning target is a write control line of the last row. If, as a result, the scanning target is a write control line of the last row, processing proceeds to step S150, and if the scanning target is not a write control line of the last row, processing returns to step S100. Note that when processing proceeds to step S112, a normal data write is performed.

At step S120, 1 is added to the count value CntM. Thereafter, a determination as to whether the count value CntM is 1 or 2 is made (step S130). If, as a result, the count value CntM is 1, processing proceeds to step S132, and if the count value CntM is 2, processing proceeds to step S134. At step S132, drive current measurement based on the first grayscale P1 is performed. At step S134, drive current measurement based on the second grayscale P2 is performed.

After completing step S132 or step S134, a determination is made as to whether the scanning target is a write control line of the last row (step S140). If, as a result, the scanning target is a write control line of the last row, processing proceeds to step S150, and if the scanning target is not a write control line of the last row, processing returns to step S100.

At step S150, the count value CntWL is initialized. Thereafter, a determination is made as to whether to satisfy conditions that "the count value CntM is 1 and the value of the compensation target line address Addr is less than or equal to the value WL_Max indicating the last row" (step S160). If, as a result, the conditions are satisfied, processing proceeds to step S162, and if the conditions are not satisfied, processing proceeds to step S164.

At step S162, the same value is assigned to the compensation target line address Addr in the compensation target line address storage memory 112. Note that this step S162 does not necessarily need to be provided. At step S164, a determination is made as to whether to satisfy conditions that "the count value CntM is 2 and the value of the compensation target line address Addr is less than or equal to the value WL_Max indicating the last row". If, as a result, the conditions are satisfied, processing proceeds to step S166, and if the conditions are not satisfied, processing proceeds to step S170. At step S166, 1 is added to the compensation target line address Addr. At step S168, the count value CntM is initialized.

At step S170, a determination is made as to whether to satisfy a condition that "the value of the compensation target line address Addr is equal to a value obtained by adding 1 to the value WL_Max indicating the last row". If, as a result, the condition is satisfied, processing proceeds to step S180, and if the condition is not satisfied, processing returns to step S100. At step S180, the compensation target line address Addr is initialized. In the above-described manner, one round of the characteristic detection process for all drive transistors in the display unit 500 ends.

<12. Compensation Process>

Figure 32:
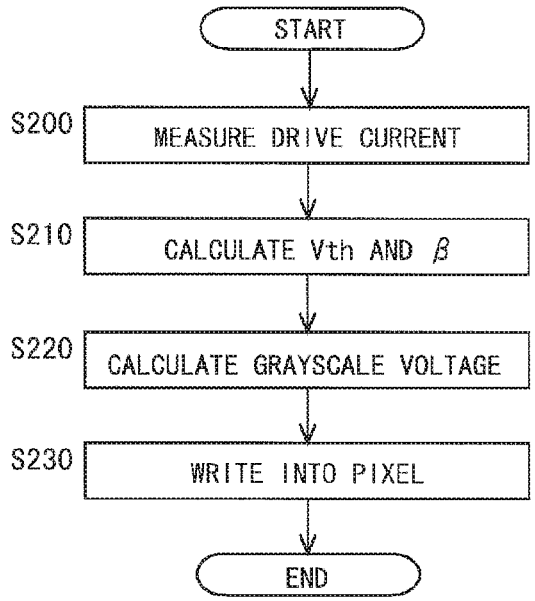
FIG. 32 is a flowchart for describing a procedure for a compensation process (a series of processes for compensating for variations in the characteristics of a drive transistor) for when focusing on one pixel (a pixel at an ith row and a jth column) in the embodiment.

FIG. 32 is a flowchart for describing a procedure for a compensation process (a series of processes for compensating for variations in the characteristics of a drive transistor) for when focusing on one pixel (a pixel at an ith row and a jth column). First, as described above, drive current measurement is performed during the characteristic detection processing period (step S200). The drive current measurement is performed based on two types of grayscales (the first grayscale P1 and the second grayscale P2: P2>P1). In the present embodiment, in two consecutive frames, drive current measurement based on the first grayscale P1 is performed in the first frame, and drive current measurement based on the second grayscale P2 is performed in the second frame. More specifically, in the first frame a drive current that is obtained by writing a first measurement grayscale voltage $Vm_{P1}$ calculated by the following equation (1) into the pixel circuit 50 is measured, and in the second frame a drive current that is obtained by writing a second measurement grayscale voltage $Vm_{P2}$ calculated by the following equation (2) into the pixel circuit 50 is measured.

[Equation 1]

$$Vm_{P1} = Vcw \times Vn(P1) \times B(i,j) + Vth(i,j) \tag{1}$$

[Equation 2]

$$Vm_{P2} = Vcw \times Vn(P2) \times B(i,j) + Vth(i,j) \tag{2}$$

where Vcw is the difference between a grayscale voltage corresponding to the minimum grayscale and a grayscale voltage corresponding to the maximum grayscale (i.e., a grayscale voltage range). Vn(P1) is a value obtained by normalizing the first grayscale P1 to a value in a range from 0 to 1, and Vn(P2) is a value obtained by normalizing the second grayscale P2 to a value in a range from 0 to 1. B(i,j) is the normalization factor for the pixel at the ith row and the jth column which is calculated by the following equation (3). Vth(i,j) is the offset value for the pixel at the ith row and the jth column (the offset value corresponds to a threshold voltage of the drive transistor).

[Equation 3]

$$B = \sqrt{\frac{\beta_0}{\beta}} \quad (3)$$

where β0 is the mean value of the gain values of all pixels, and β is the gain value of the pixel at the ith row and the jth column.

After performing drive current measurement based on the two types of grayscales, calculation of the offset value Vth and the gain value β is performed based on the measured values (step S210). The process at this step S210 is performed by the correction arithmetic circuit 122 (see FIG. 18). Upon calculation of the offset value Vth and the gain value β, the following equation (4) is used that represents a relationship between the drain-source current (drive current) Ids of the transistor and the gate-source voltage Vgs thereof:

[Equation 4]

$$Ids = \beta \times (Vgs - Vth)^2 \quad (4)$$

Specifically, the offset value shown in the following equation (5) and the gain value shown in the following equation (6) are obtained from simultaneous equations including an equation where the measurement result based on the first grayscale P1 is substituted into the above equation (4) and an equation where the measurement result based on the second grayscale P2 is substituted into the above equation (4):

[Equation 5]

$$Vth = \frac{Vgs_{P2}\sqrt{IO_{P1}} - Vgs_{P1}\sqrt{IO_{P2}}}{\sqrt{IO_{P1}} - \sqrt{IO_{P2}}} \quad (5)$$

[Equation 6]

$$\beta = \frac{(\sqrt{IO_{P1}} - \sqrt{IO_{P2}})^2}{(Vgs_{P1} - Vgs_{P2})^2} \quad (6)$$

where $IO_{P1}$ is the drive current that is the measurement result based on the first grayscale P1, and $IO_{P2}$ is the drive current that is the measurement result based on the second grayscale P2.

Using the offset value Vth and the gain value β which are calculated in the above-described manner, the correction data held in the nonvolatile memory 123 (see FIG. 18) in the correction data calculation and storage unit 120 is updated. Note that in order that the process at step S210 can be performed at high speed, data of the measured values obtained at step S200 is temporarily stored in a memory capable of performing high speed access, such as an SRAM (Static Random Access Memory) or a DRAM (Dynamic Random Access Memory).

Then, when a voltage is written into the pixel circuit 50 at the ith row and the jth column, a grayscale voltage is calculated by the following equation (7) using the offset value Vth and the gain value β (step S220). The process at this step S220 is performed by the grayscale correcting unit 130 (see FIG. 2).

[Equation 7]

$$V_P = \left( Vcw \times Vn(P) \times \sqrt{\frac{\beta_0}{\beta}} + Vth \right) \quad (7)$$

where Vn(P) is a value obtained by normalizing a display grayscale of the pixel at the ith row and the jth column to a value in a range from 0 to 1.

Thereafter, the grayscale voltage calculated at step S220 is written into the pixel circuit 50 at the ith row and the jth column (step S230). By performing a compensation process such as that described above on all pixels, variations in the characteristics of the drive transistors are compensated for.

Figure 33:
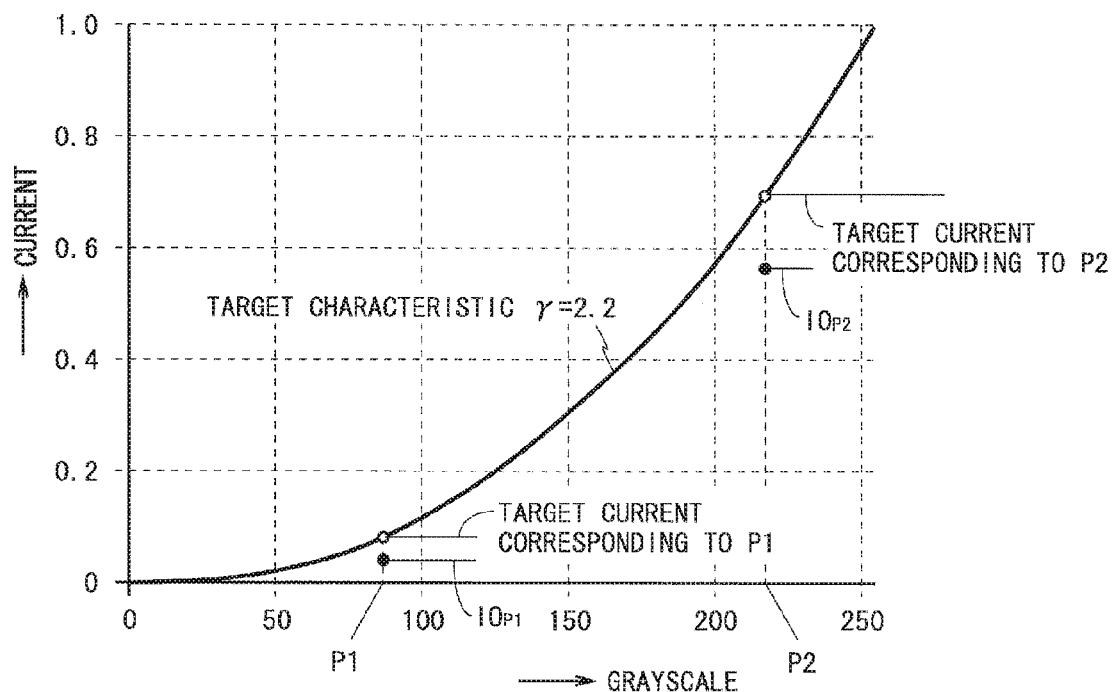
FIG. 33 is a diagram showing a grayscale-current characteristic in the embodiment.

FIG. 33 is a diagram showing a grayscale-current characteristic. FIG. 33 shows a characteristic of γ=2.2 as a target characteristic. When degradation occurs in a drive transistor, a drive current $IO_{P1}$ obtained when a write based on the first grayscale P1 is performed does not match a target current corresponding to the first grayscale P1, and a drive current $IO_{P2}$ obtained when a write based on the second grayscale P2 is performed does not match a target current corresponding to the second grayscale P2. In the present embodiment, however, the offset value Vth and the gain value β are calculated by the above-described method, based on the drive currents $IO_{P1}$ and $IO_{P2}$. Then, using the offset value Vth and the gain value β, the grayscale voltage corresponding to each grayscale is corrected. By this, for any grayscale, a drive current obtained when a grayscale voltage is written into a pixel circuit 50 substantially matches a target current. Accordingly, the occurrence of luminance nonuniformity on a display screen is suppressed, and high image quality display is performed.

<13. Effects>

According to the present embodiment, in the display control circuit 100 there is provided the matching circuit 113 that determines whether a count value CntWL (count value CntWL indicating a scanning target row) matches a compensation target line address Addr indicating a compensation target row, the count value CntWL being obtained based on clock signals CLK1 and CLK2 that control the operation of the write control line drive circuit 300. Then, if the count value CntWL matches the compensation target line address Addr, the display control circuit 100 stops the clock operation of the clock signals CLK1 and CLK2 for a predetermined period (current measurement period) from a time point that is one horizontal scanning period after a time point where they match each other. In addition, the display control circuit 100 controls the clock operation of the clock signals CLK1 and CLK2 such that pulses of the same clock signal occur before and after the current measurement period. By this, during the characteristic detection processing period, a write control line G1_WL(n) of the compensation target row goes into a selected state twice. In addition, each unit circuit 40 in the shift register 4 composing the monitoring control line drive circuit 400 is provided with an output terminal 48 that outputs a state signal Q for controlling the operation of other stages; and an output terminal 49 connected to a monitoring control line G2_Moni. Between the output terminal 48 and the output terminal 49 is provided a transistor T49 whose on/off is controlled by a monitoring enable signal Moni_EN provided from the display control circuit 100. Then, if the count value CntWL matches the compensation target line address Addr, the display control circuit 100 brings the monitoring enable signal Moni_EN to a high level for a predetermined period (current measurement period)

from a time point that is one horizontal scanning period after a time point where they match each other, and stops the clock operation of clock signals CLK3 and CLK4 during the current measurement period. By this, in each frame, a monitoring control line G2_Moni(n) of the compensation target row goes into a selected state during a current measurement period included in the characteristic detection processing period, and all monitoring control lines G2_Moni are maintained in a non-selected state during other periods. By driving the write control lines G1_WL and the monitoring control lines G2_Moni in the above-described manner, in each frame, drive current measurement for detecting characteristics of drive transistors is performed. Then, correction data is obtained based on the measured values of drive currents, and grayscale voltages are corrected based on the correction data. As a result, variations in the characteristics of the drive transistors are compensated for. Here, the shift registers in the gate driver circuits (the write control line drive circuit 300 and the monitoring control line drive circuit 400) that implement the above-described operation are formed using TFTs of only an N-channel type. By the above, according to the present embodiment, it becomes possible to compensate for variations in the characteristics of the drive transistors in the organic EL display device 1 that adopts the gate driver circuits formed of single-channel TFTs.

The gate driver circuits that perform complex operation such as that described in this specification are generally implemented by CMOS logic circuits. Hence, according to conventional art, when TFTs other than polysilicon TFTs are adopted as TFTs composing the gate driver circuits, the gate driver circuits that perform complex operation such as that described above cannot be formed on a glass substrate. Therefore, the gate driver circuits need to be mounted on a glass substrate in IC chip form. Regarding this point, according to the present embodiment, complex operation such as that described above is implemented by gate driver circuits formed using TFTs of only an N-channel type. Hence, the gate driver circuits can be formed on a glass substrate without being formed in IC form. As a result, a reduction in the cost of a display device is achieved.

<14. Variants>

Variants of the above-described embodiment will be described below.

<14.1 First Variant>

Figure 34:
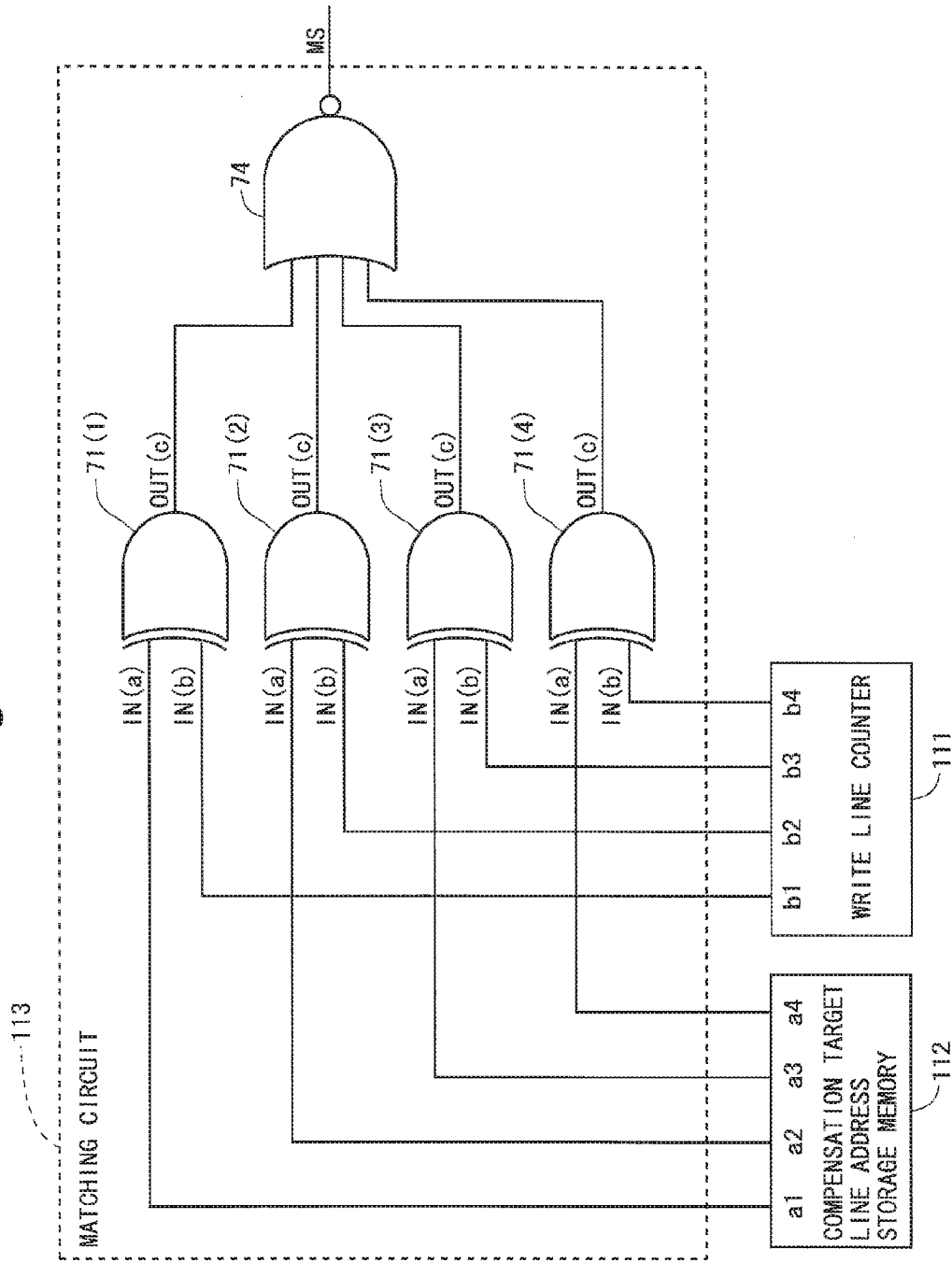
FIG. 34 is a logic circuit diagram showing a configuration of a matching circuit in a first variant of the embodiment.

FIG. 34 is a logic circuit diagram showing a configuration of a matching circuit 113 in a first variant of the embodiment. In the present variant, a NOR circuit (NOT-OR circuit) 74 is provided instead of the inverters 72(1) to 72(4) and the AND circuit 73 of the embodiment (see FIG. 15). The NOR circuit 74 outputs a value indicating the NOR of four pieces of first output data OUT(c) outputted from EXOR circuits 71(1) to 71(4), as a matching signal MS.

When the value of first input data IN (a) matches the value of second input data IN (b), the value of first output data OUT (c) is 0. When the value of first input data IN(a) does not match the value of second input data IN(b), the value of first output data OUT(c) is 1. Therefore, when the value of first input data IN(a) matches the value of second input data IN(b) in all of the EXOR circuits 71(1) to 71(4), the values inputted to the NOR circuit 74 are all 0 and thus the value outputted from the NOR circuit 74 is 1. That is, when a count value CntWL outputted from the write line counter 111 matches a compensation target line address Addr stored in the compensation target line address storage memory 112, the matching signal MS goes to a high level.

Figure 35:
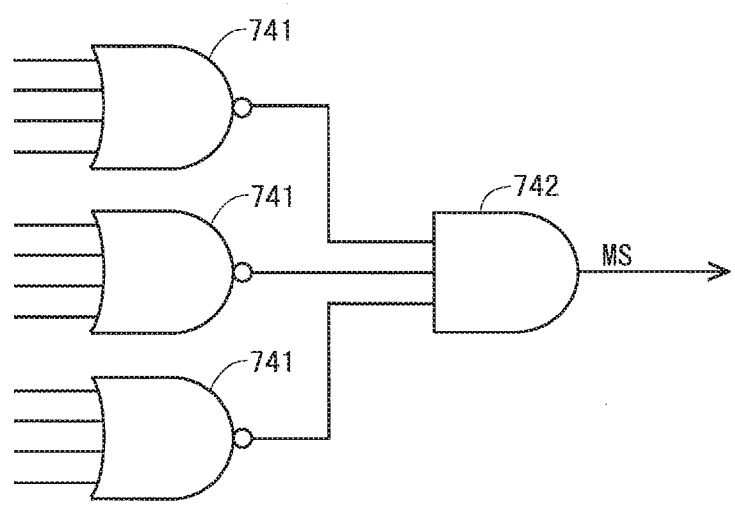
FIG. 35 is a logic circuit diagram showing one exemplary configuration for a case in which the number of pieces of data inputted to a NOR circuit is large in the first variant of the embodiment.

As described above, the matching circuit 113 can also be configured in the manner shown in FIG. 34. Note that when the number of pieces of data inputted to the NOR circuit 74 is large, the configuration may be such that a plurality of NOR circuits 741 and one AND circuit 742 are provided instead of one NOR circuit 74, for example, as shown in FIG. 35.

<14.2 Second Variant>

Figure 36:
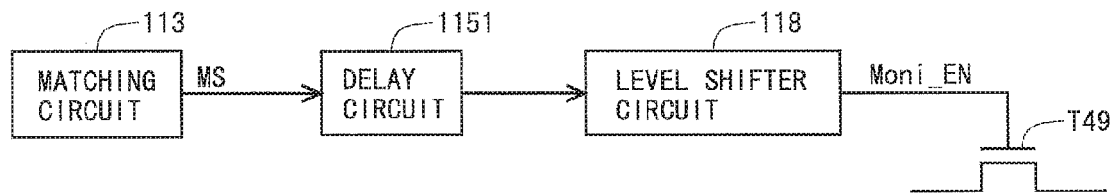
FIG. 36 is a diagram for describing how to provide a monitoring enable signal to a transistor T49 in a unit circuit in a second variant of the embodiment.
Figure 37:
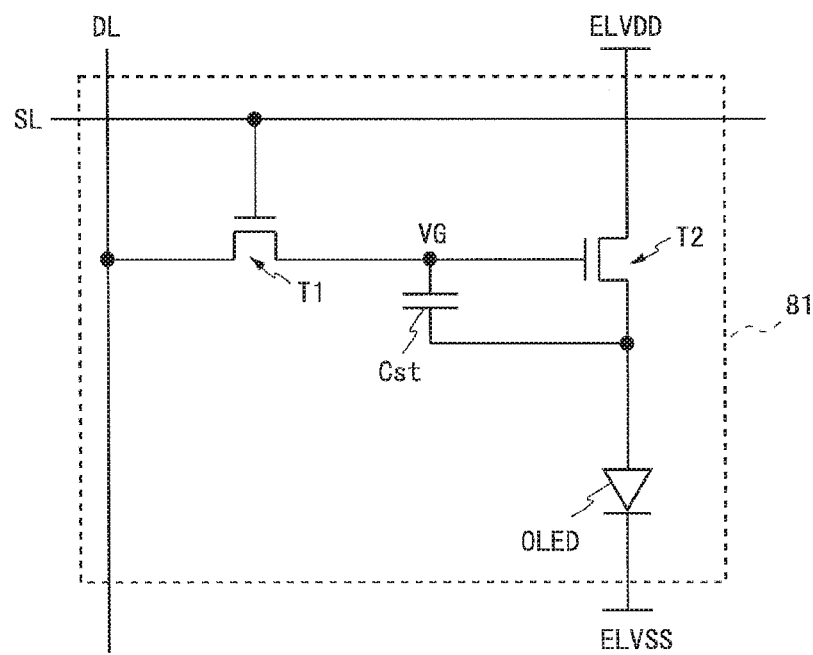
FIG. 37 is a circuit diagram showing a configuration of a conventional common pixel circuit.
Figure 38:
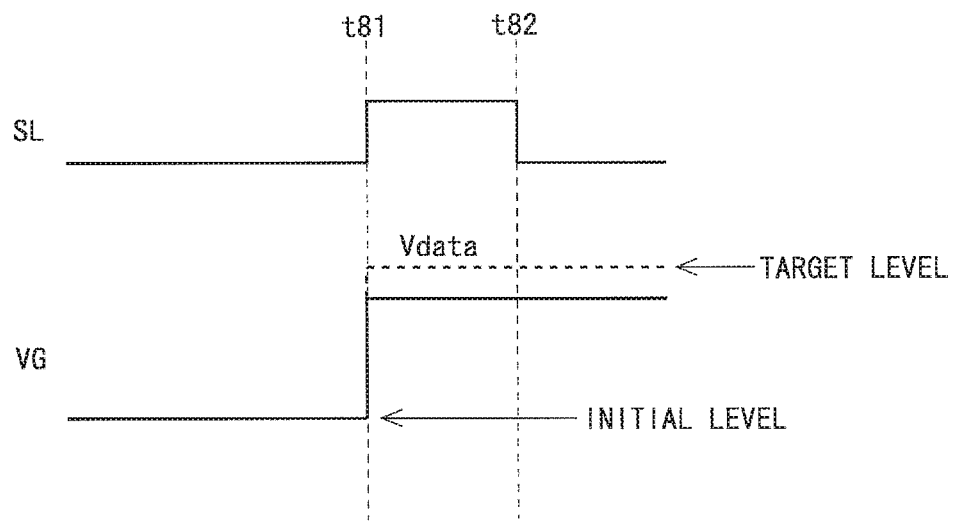
FIG. 38 is a timing chart for describing the operation of the pixel circuit shown in FIG. 37.
Figure 39:
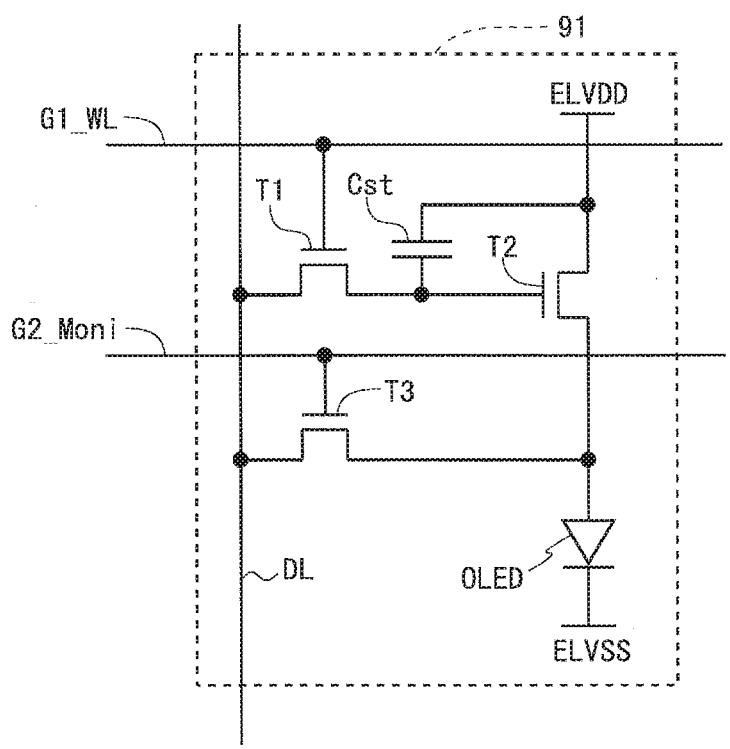
FIG. 39 is a circuit diagram showing an exemplary configuration of a pixel circuit for enabling drive current measurement to perform compensation according to the characteristics of a drive transistor.
Figure 40:
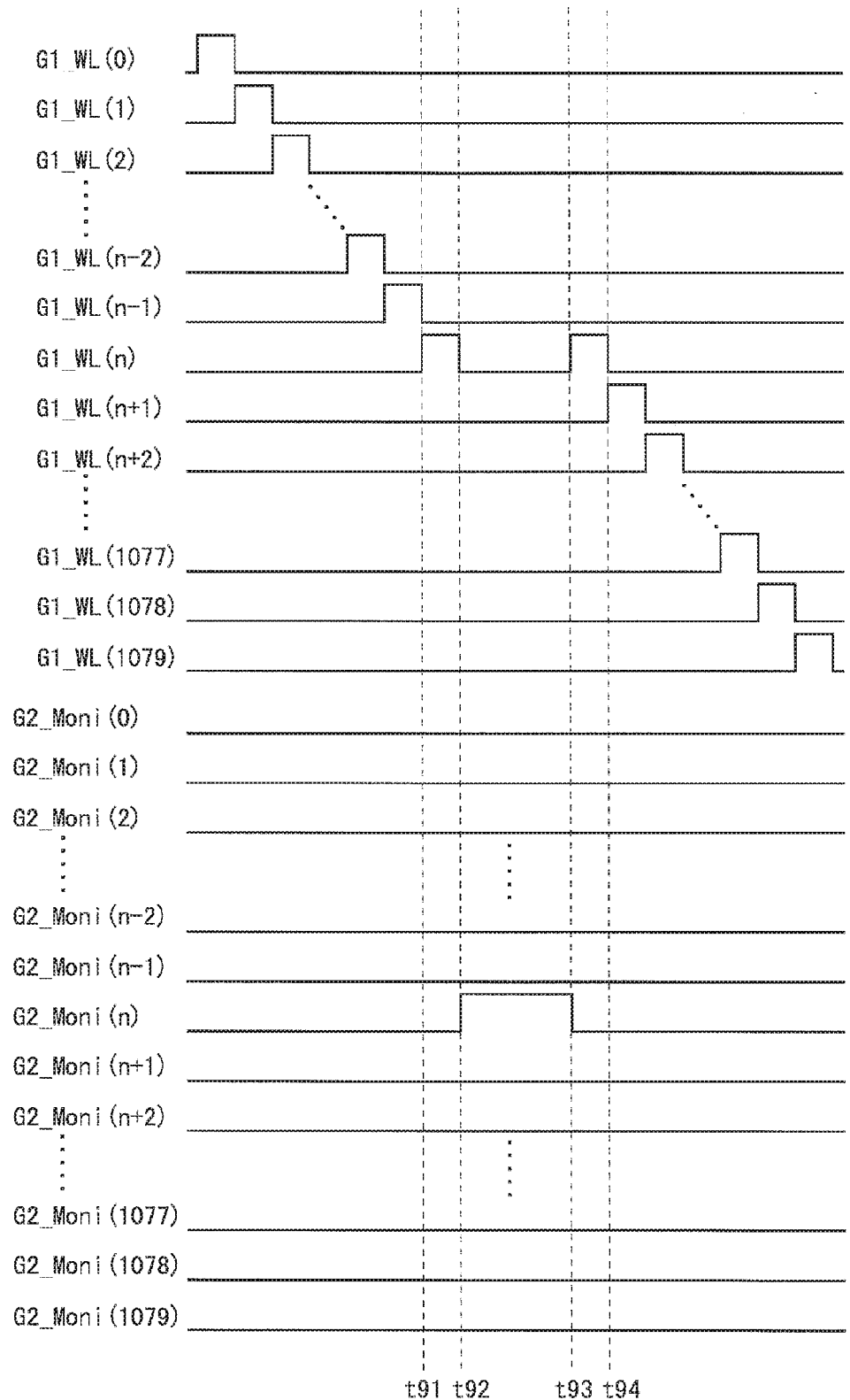
FIG. 40 is a timing chart for describing drive of write control lines and monitoring control lines.

In the above-described embodiment, as shown in FIG. 25, a monitoring enable signal Moni_EN outputted from the delay circuit 1151 is provided to the transistor T49. In this case, only a logic power supply voltage can be provided as the monitoring enable signal Moni_EN to the transistor T49. Hence, the level of the voltage provided to the transistor T49 may not reach a level sufficient to bring the monitoring control line G2_Moni into a selected state. Hence, in the present variant, as shown in FIG. 36, a level shifter circuit 118 is provided at a stage subsequent to the delay circuit 1151.

In the level shifter circuit 118, a logic voltage is boosted to a desired level. By this, it becomes possible to securely increase the level of the voltage provided to the transistor T49 to a level sufficient to bring the monitoring control line G2_Moni into a selected state. Note that the level shifter circuit 118 may be implemented by a CMOS circuit.

<15. Others>

The present invention is not limited to the above-described embodiment and variants and may be implemented by making various modifications thereto without departing from the true scope and spirit of the present invention. For example, although the above-described embodiment describes an organic EL display device as an example, the present invention can also be applied to other display devices than organic EL display devices as long as the display devices include current-driven self light-emitting type display elements. In addition, although the above-described embodiment describes an example in which gate driver circuits are formed using TFTs of only an N-channel type, the present invention can also be applied to a case in which gate driver circuits are formed using TFTs of only a P-channel type.

DESCRIPTION OF REFERENCE CHARACTERS

1: ORGANIC EL DISPLAY DEVICE
3 and 4: SHIFT REGISTER
6: ORGANIC EL PANEL
30 and 40: UNIT CIRCUIT (IN THE SHIFT REGISTERS)
50: PIXEL CIRCUIT
100: DISPLAY CONTROL CIRCUIT
110: DRIVE CONTROL UNIT
111: WRITE LINE COUNTER
112: COMPENSATION TARGET LINE ADDRESS STORAGE MEMORY
113: MATCHING CIRCUIT
114: MATCHING COUNTER
115: STATUS MACHINE
116: IMAGE DATA AND SOURCE CONTROL SIGNAL GENERATING CIRCUIT
117: GATE CONTROL SIGNAL GENERATING CIRCUIT
120: CORRECTION DATA CALCULATION AND STORAGE UNIT
130: GRAYSCALE CORRECTING UNIT
200: DATA LINE DRIVE AND CURRENT MEASUREMENT CIRCUIT

300: WRITE CONTROL LINE DRIVE CIRCUIT
400: MONITORING CONTROL LINE DRIVE CIRCUIT
500: DISPLAY UNIT
T1: INPUT TRANSISTOR
T2: DRIVE TRANSISTOR
T3: MONITORING CONTROL TRANSISTOR
Cst: CAPACITOR
DL and DL(0) to DL(5978): DATA LINE
G1_WL and G1_WL(0) to G1_WL(1079): WRITE CONTROL LINE
G2_Moni and G2_Moni(0) to G2_Moni(1079): MONITORING CONTROL LINE
CLK1 to CLK4: CLOCK SIGNAL
Moni_EN: MONITORING ENABLE SIGNAL
MS: MATCHING SIGNAL
Addr: COMPENSATION TARGET LINE ADDRESS
CntWL: COUNT VALUE OUTPUTTED FROM THE WRITE LINE COUNTER

The invention claimed is:

1. A display device having a plurality of pixel circuits formed in a matrix form, each of the pixel circuits including an electrooptical element whose luminance is controlled by a current; and a drive transistor configured to control a current to be supplied to the electrooptical element, the display device comprising:
   a plurality of write control lines provided for respective rows and configured to control whether to write data voltages into the pixel circuits of the corresponding rows;
   a plurality of monitoring control lines provided for the respective rows and configured to control whether to measure drive currents to be supplied to the drive transistors included in the pixel circuits of the corresponding rows;
   a plurality of data lines provided for respective columns and configured to supply the data voltages to the pixel circuits of the corresponding columns;
   a write control line drive circuit including a first shift register that includes a plurality of first unit circuits having a one-to-one correspondence with the plurality of write control lines and that operates based on a first clock signal group, and configured to bring a write control line corresponding to a first unit circuit being in an active state into a selected state, the first shift register being configured such that the plurality of first unit circuits sequentially go into an active state based on the first clock signal group;
   a monitoring control line drive circuit configured to bring a monitoring control line corresponding to a measurement target row into a selected state, the measurement target row being a row targeted for drive current measurement;
   a data line drive circuit configured to apply the data voltages to the plurality of data lines;
   a current measurement circuit configured to measure drive currents supplied from the plurality of pixel circuits;
   a drive control unit configured to control operation of the write control line drive circuit, the monitoring control line drive circuit, the data line drive circuit, and the current measurement circuit;
   a correction data calculation and storage unit configured to calculate correction data for correcting grayscale data corresponding to display grayscales of the respective pixel circuits, based on the drive currents measured by the current measurement circuit, and to hold the correction data; and
   a grayscale correcting unit configured to obtain data voltages to be written into the respective pixel circuits by correcting the grayscale data based on the correction data held in the correction data calculation and storage unit, wherein
   the monitoring control line drive circuit includes a second shift register that includes a plurality of second unit circuits having a one-to-one correspondence with the plurality of monitoring control lines and that operates based on a second clock signal group and a monitoring enabling signal, and brings a monitoring control line corresponding to a second unit circuit being in an active state into a selected state when the monitoring enabling signal is active, the second shift register being configured such that the plurality of second unit circuits sequentially go into an active state based on the second clock signal group;
   the drive control unit includes:
      a clock counter configured to count numbers of clock pulses of the first clock signal group;
      a measurement target address value storage unit configured to hold a measurement target address value indicating the measurement target row; and
      a matching determination circuit configured to determine whether a value of the clock counter matches the measurement target address value,
   a predetermined period from a time point that is one clock period after a time point where the matching determination circuit determines that the value of the clock counter matches the measurement target address value is set as a current measurement period during which drive current measurement by the current measurement circuit is performed, and
   the drive control unit:
      controls the first clock signal group such that only a potential of one of clock signals that is provided to a first unit circuit corresponding to the measurement target row changes at a start time point and an end time point of the current measurement period, and that clock operation performed by the first clock signal group stops throughout the current measurement period, the clock signals being included in the first clock signal group; and
      controls the second clock signal group such that after potentials of clock signals included in the second clock signal group change at the start time point of the current measurement period, clock operation performed by the second clock signal group stops throughout the current measurement period.

2. The display device according to claim 1, wherein each of the second unit circuits includes:
   a first output terminal connected to a preceding stage and a subsequent stage and configured to output a state signal indicating an internal state;
   a second output terminal connected to a corresponding monitoring control line; and
   an output control transistor having a control terminal to which the monitoring enabling signal is provided; a first conduction terminal connected to the first output terminal; and a second conduction terminal connected to the second output terminal.

3. The display device according to claim 2, further comprising a level shifter circuit configured to convert a voltage level of the monitoring enabling signal provided to the control terminal of the output control transistor.

4. The display device according to claim 1, wherein
the current measurement circuit performs drive current measurement based on a first grayscale and drive current measurement based on a second grayscale,
the drive control unit further includes a grayscale identification counter configured to identify whether the drive current measurement based on the first grayscale is performed or the drive current measurement based on the second grayscale is performed in each frame period, and
the correction data calculation and storage unit calculates the correction data based on two types of drive currents measured by the current measurement circuit, with reference to a value of the grayscale identification counter.

5. The display device according to claim 4, wherein in two consecutive frame periods, the drive current measurement based on the first grayscale and the drive current measurement based on the second grayscale are performed for pixel circuits of a same row.

6. The display device according to claim 1, wherein
the value of the clock counter and the measurement target address value are represented by a same number of bits, and
the matching determination circuit includes:
  a plurality of exclusive-OR circuits each configured to output an exclusive-OR of corresponding bits of the value of the clock counter and the measurement target address value;
  a plurality of NOT circuits provided so as to have a one-to-one correspondence with the plurality of exclusive-OR circuits, and configured to output NOTs of the outputs from the corresponding exclusive-OR circuits; and
  an AND circuit configured to output an AND of the outputs from the plurality of NOT circuits.

7. The display device according to claim 1, wherein
the value of the clock counter and the measurement target address value are represented by a same number of bits, and
the matching determination circuit includes:
  a plurality of exclusive-OR circuits each configured to output an exclusive-OR of corresponding bits of the value of the clock counter and the measurement target address value; and
  a NOT-OR circuit configured to output a NOR of the outputs from the plurality of exclusive-OR circuits.

8. The display device according to claim 1, wherein
each of the first unit circuits and each of the second unit circuits includes:
  a first node;
  a first output terminal configured to output a state signal indicating an internal state;
  a first transistor having a control terminal and a first conduction terminal to which a state signal outputted from a preceding stage is provided, and a second conduction terminal connected to the first node;
  a second transistor having a control terminal connected to the first node; a first conduction terminal to which a control clock signal is provided; and a second conduction terminal connected to the first output terminal;
  a third transistor having a control terminal to which a state signal outputted from a subsequent stage is provided; a first conduction terminal connected to the first output terminal; and a second conduction terminal to which an off-level direct-current power supply voltage is provided; and
  a fourth transistor having a control terminal to which a state signal outputted from a subsequent stage is provided; a first conduction terminal connected to the first node; and a second conduction terminal to which the off-level direct-current power supply voltage is provided,
one signal included in the first clock signal group is provided as the control clock signal to the first conduction terminal of the second transistor included in each of the first unit circuits,
one signal included in the second clock signal group is provided as the control clock signal to the first conduction terminal of the second transistor included in each of the second unit circuits,
the first output terminal included in each of the first unit circuits is connected to a corresponding write control line, and
each of the second unit circuits further includes:
  a second output terminal connected to a corresponding monitoring control line; and
  an output control transistor having a control terminal to which the monitoring enabling signal is provided; a first conduction terminal connected to the first output terminal; and a second conduction terminal connected to the second output terminal.

9. The display device according to claim 1, wherein transistors forming the plurality of first unit circuits and the plurality of second unit circuits are thin film transistors containing indium gallium zinc oxide.

10. The display device according to claim 1, wherein the plurality of first unit circuits are formed using transistors of only one of an N-channel type and a P-channel type,
the plurality of second unit circuits are formed using transistors of only one of the N-channel type and the P-channel type that is a same type as the transistors forming the plurality of first unit circuits.

11. The display device according to claim 1, wherein one row is set as the measurement target row per frame period.

12. The display device according to claim 1, wherein the drive control unit makes the monitoring enabling signal active only during the current measurement period.

13. A method for driving a display device having a plurality of pixel circuits formed in a matrix form, each of the pixel circuits including an electrooptical element whose luminance is controlled by a current; and a drive transistor configured to control a current to be supplied to the electrooptical element, the method comprising:
  a drive controlling step of controlling drive operation of the display device;
  a current measuring step of measuring drive currents to be supplied to the drive transistors included in the respective pixel circuits;
  a correction data calculating step of calculating correction data for correcting grayscale data corresponding to display grayscales of the respective pixel circuits, based on the drive currents measured in the current measuring step; and
  a grayscale correcting step of obtaining data voltages to be written into the respective pixel circuits by correcting the grayscale data based on the correction data calculated in the correction data calculating step, wherein the display device includes:
- a plurality of write control lines provided for respective rows and configured to control whether to write the data voltages into the pixel circuits of the corresponding rows;
- a plurality of monitoring control lines provided for the respective rows and configured to control whether to measure drive currents to be supplied to the drive transistors included in the pixel circuits of the corresponding rows;
- a plurality of data lines provided for respective columns and configured to supply the data voltages to the pixel circuits of the corresponding columns;
- a write control line drive circuit including a first shift register that includes a plurality of first unit circuits having a one-to-one correspondence with the plurality of write control lines and that operates based on a first clock signal group, and configured to bring a write control line corresponding to a first unit circuit being in an active state into a selected state, the first shift register being configured such that the plurality of first unit circuits sequentially go into an active state based on the first clock signal group; and
- a monitoring control line drive circuit configured to bring a monitoring control line corresponding to a measurement target row into a selected state, the measurement target row being a row targeted for drive current measurement, the plurality of first unit circuits are formed using transistors of only one of an N-channel type and a P-channel type, the monitoring control line drive circuit includes a second shift register that includes a plurality of second unit circuits having a one-to-one correspondence with the plurality of monitoring control lines and that operates based on a second clock signal group and a monitoring enabling signal, and brings a monitoring control line corresponding to a second unit circuit being in an active state into a selected state when the monitoring enabling signal is active, the second shift register being configured such that the plurality of second unit circuits sequentially go into an active state based on the second clock signal group;

the plurality of second unit circuits are formed using transistors of only one of the N-channel type and the P-channel type that is a same type as the transistors forming the plurality of first unit circuits, one row is set as the measurement target row per frame period, the drive controlling step includes:
- a clock pulse counting step of counting numbers of clock pulses of the first clock signal group; and
- a matching determining step of determining whether a value counted in the clock pulse counting step matches a measurement target address value indicating the measurement target row, a predetermined period from a time point that is one clock period after a time point where it is determined in the matching determining step that the value counted in the clock pulse counting step matches the measurement target address value is set as a current measurement period during which drive current measurement in the current measuring step is performed, and in the drive controlling step,
- the first clock signal group is controlled such that only a potential of one of clock signals that is provided to a first unit circuit corresponding to the measurement target row changes at a start time point and an end time point of the current measurement period, and that clock operation performed by the first clock signal group stops throughout the current measurement period, the clock signals being included in the first clock signal group;
- the second clock signal group is controlled such that after potentials of clock signals included in the second clock signal group change at the start time point of the current measurement period, clock operation performed by the second clock signal group stops throughout the current measurement period; and
- the monitoring enabling signal is made active only during the current measurement period.

14. A display device having a plurality of pixel circuits formed in a matrix form, each of the pixel circuits including an electrooptical element whose luminance is controlled by a current; and a drive transistor configured to control a current to be supplied to the electrooptical element, the display device comprising: a plurality of write control lines provided for respective rows and configured to control whether to write data voltages into the pixel circuits of the corresponding rows; a plurality of monitoring control lines provided for the respective rows and configured to control whether to measure drive currents to be supplied to the drive transistors included in the pixel circuits of the corresponding rows; a plurality of data lines provided for respective columns and configured to supply the data voltages to the pixel circuits of the corresponding columns; a write control line drive circuit including a first shift register that includes a plurality of first unit circuits having a one-to-one correspondence with the plurality of write control lines and that operates based on a first clock signal group, and configured to bring a write control line corresponding to a first unit circuit being in an active state into a selected state, the first shift register being configured such that the plurality of first unit circuits sequentially go into an active state based on the first clock signal group; a monitoring control line drive circuit configured to bring a monitoring control line corresponding to a measurement target row into a selected state, the measurement target row being a row targeted for drive current measurement; a data line drive circuit configured to apply the data voltages to the plurality of data lines; a current measurement circuit configured to measure drive currents supplied from the plurality of pixel circuits; a drive control unit configured to control operation of the write control line drive circuit, the monitoring control line drive circuit, the data line drive circuit, and the current measurement circuit; a correction data calculation and storage unit configured to calculate correction data for correcting grayscale data corresponding to display grayscales of the respective pixel circuits, based on the drive currents measured by the current measurement circuit, and to hold the correction data; and a grayscale correcting unit configured to obtain data voltages to be written into the respective pixel circuits by correcting the grayscale data based on the correction data held in the correction data calculation and storage unit, wherein the plurality of first unit circuits are formed using transistors of only one of an N-channel type and a P-channel type, the monitoring control line drive circuit includes a second shift register that includes a plurality of second unit circuits having a one-to-one correspondence with the plurality of monitoring control lines and that operates based on a second clock signal group and a monitoring enabling signal, and brings a monitoring control line corresponding to a second unit circuit being in an active state into a selected state when the monitoring enabling signal is active, the second shift register being configured such that the plurality of second unit circuits sequentially go into an active state based on the second clock signal group; the plurality of second unit circuits are formed using transistors of only one of the N-channel type and the P-channel type that is a same type as the transistors forming the plurality of first unit circuits, one row is set as the measurement target row per frame period, the drive control unit includes: a clock counter configured to count numbers of clock pulses of the first clock signal group; a measurement target address value storage unit configured to hold a measurement target address value indicating the measurement target row; and a matching determination circuit configured to determine whether a value of the clock counter matches the measurement target address value, a predetermined period from a time point that is one clock period after a time point where the matching determination circuit determines that the value of the clock counter matches the measurement target address value is set as a current measurement period during which drive current measurement by the current measurement circuit is performed, and the drive control unit: controls the first clock signal group such that only a potential of one of clock signals that is provided to a first unit circuit corresponding to the measurement target row changes at a start time point and an end time point of the current measurement period, and that clock operation performed by the first clock signal group stops throughout the current measurement period, the clock signals being included in the first clock signal group; controls the second clock signal group such that after potentials of clock signals included in the second clock signal group change at the start time point of the current measurement period, clock operation performed by the second clock signal group stops throughout the current measurement period; and makes the monitoring enabling signal active only during the current measurement period.

\* \* \* \* \*